(12) United States Patent
Yamazaki

(10) Patent No.: US 9,812,586 B2
(45) Date of Patent: Nov. 7, 2017

(54) TRANSISTOR WITH CURVED ACTIVE LAYER

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/518,237

(22) Filed: Oct. 20, 2014

(65) Prior Publication Data

US 2015/0108552 A1    Apr. 23, 2015

(30) Foreign Application Priority Data

Oct. 22, 2013   (JP) .................. 2013-219046

(51) Int. Cl.
| | |
|---|---|
| *H01L 29/786* | (2006.01) |
| *H01L 29/423* | (2006.01) |
| *H01L 29/66* | (2006.01) |

(52) U.S. Cl.
CPC .. *H01L 29/78696* (2013.01); *H01L 29/42384* (2013.01); *H01L 29/66969* (2013.01);
(Continued)

(58) Field of Classification Search
CPC ........... H01L 29/7869; H01L 29/78693; H01L 29/78696; H01L 29/0657; H01L 29/0661; H01L 29/1025
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| (Continued) | | |

FOREIGN PATENT DOCUMENTS

| | | |
|---|---|---|
| EP | 1737044 A | 12/2006 |
| EP | 2226847 A | 9/2010 |
| (Continued) | | |

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.
(Continued)

*Primary Examiner* — Daniel Luke
(74) *Attorney, Agent, or Firm* — Fish & Richardson P.C.

(57) ABSTRACT

In a cross section in a channel width direction, a semiconductor layer includes a first region of which one end portion is in contact with an insulating layer and which is positioned at one side portion of the semiconductor layer; a second region of which one end portion is in contact with the other end portion of the first region and which is positioned at an upper portion of the semiconductor layer; and a third region of which one end portion is in contact with the other end portion of the second region and the other end portion is in contact with the insulating layer and which is positioned at the other side portion of the semiconductor layer. In the second region, an interface with a gate insulating film is convex and has three regions respectively having curvature radii R1, R2, and R3 that are connected in this order from the one end portion side toward the other. R2 is larger than R1 and R3.

25 Claims, 34 Drawing Sheets

(52) U.S. Cl.
CPC .... *H01L 29/7869* (2013.01); *H01L 29/78693* (2013.01); *H01L 2029/42388* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,037,790 B2 | 5/2006 | Chang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,504,678 B2 | 3/2009 | Chau et al. |
| 7,674,650 B2 | 3/2010 | Akimoto et al. |
| 7,732,819 B2 | 6/2010 | Akimoto et al. |
| 7,898,041 B2 | 3/2011 | Radosavljevic et al. |
| 8,089,117 B2 | 1/2012 | Shimizu |
| 8,164,152 B2 | 4/2012 | Lee et al. |
| 8,193,567 B2 | 6/2012 | Kavalieros et al. |
| 8,207,531 B2 | 6/2012 | Takahashi et al. |
| 8,217,435 B2 | 7/2012 | Chang et al. |
| 8,283,653 B2 | 10/2012 | Pillarisetty et al. |
| 8,373,237 B2 | 2/2013 | Park et al. |
| 8,420,456 B2 | 4/2013 | Okamoto |
| 8,502,221 B2 | 8/2013 | Yamazaki |
| 9,006,736 B2 | 4/2015 | Sasagawa et al. |
| 9,166,060 B2 | 10/2015 | Yamazaki et al. |
| 9,202,925 B2 | 12/2015 | Yamazaki et al. |
| 9,252,283 B2 | 2/2016 | Matsubayashi et al. |
| 9,257,569 B2 | 2/2016 | Yamazaki et al. |
| 9,287,408 B2 | 3/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0094793 A1 | 5/2004 | Noguchi et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308911 A1* | 12/2008 | Okamoto ..................... 257/623 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0049509 A1 | 3/2011 | Takahashi et al. |
| 2011/0240991 A1 | 10/2011 | Yamazaki |
| 2012/0161125 A1* | 6/2012 | Yamazaki ..................... 257/43 |
| 2012/0205651 A1 | 8/2012 | Lee et al. |
| 2012/0267624 A1* | 10/2012 | Isobe .................. H01L 27/0688 257/43 |
| 2013/0175530 A1 | 7/2013 | Noda et al. |
| 2013/0320330 A1 | 12/2013 | Yamazaki et al. |
| 2013/0320334 A1 | 12/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | H03-22567 | 1/1991 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2007-096055 A | 4/2007 |
| JP | 2007-123861 A | 5/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and ScO3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Sof. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

* cited by examiner

FIG. 16A
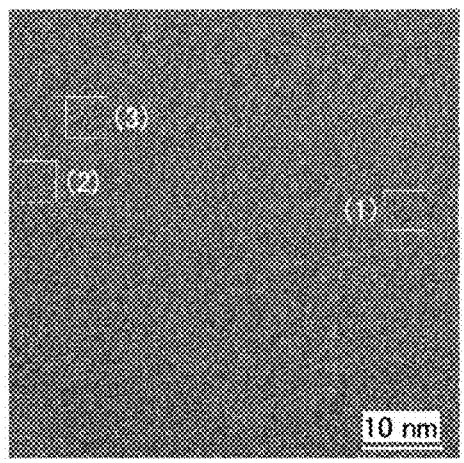
FIG. 16B          FIG. 16C          FIG. 16D
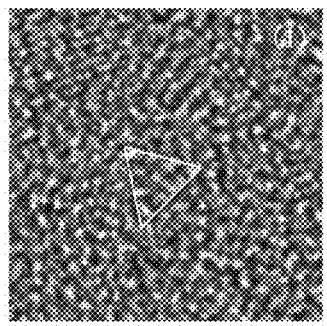 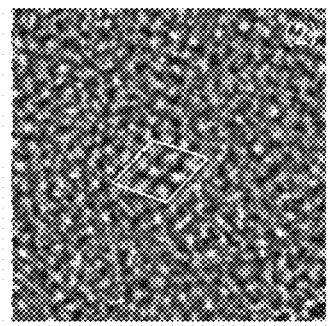 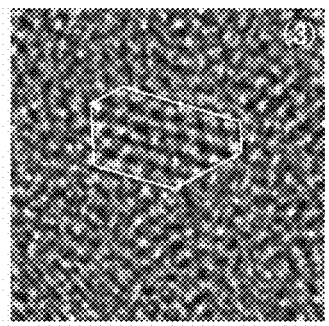

Out-of-plane
CAAC-OS

In-plane φ scan
CAAC-OS

In-plane φ scan
single crystal OS

FIG. 18A
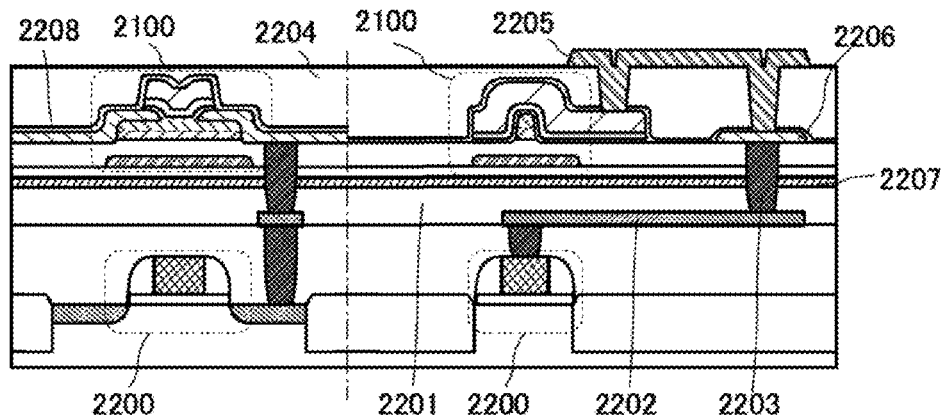
FIG. 18B  FIG. 18C
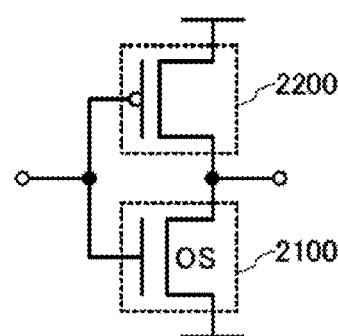 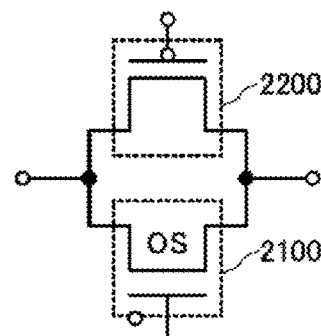
FIG. 18D
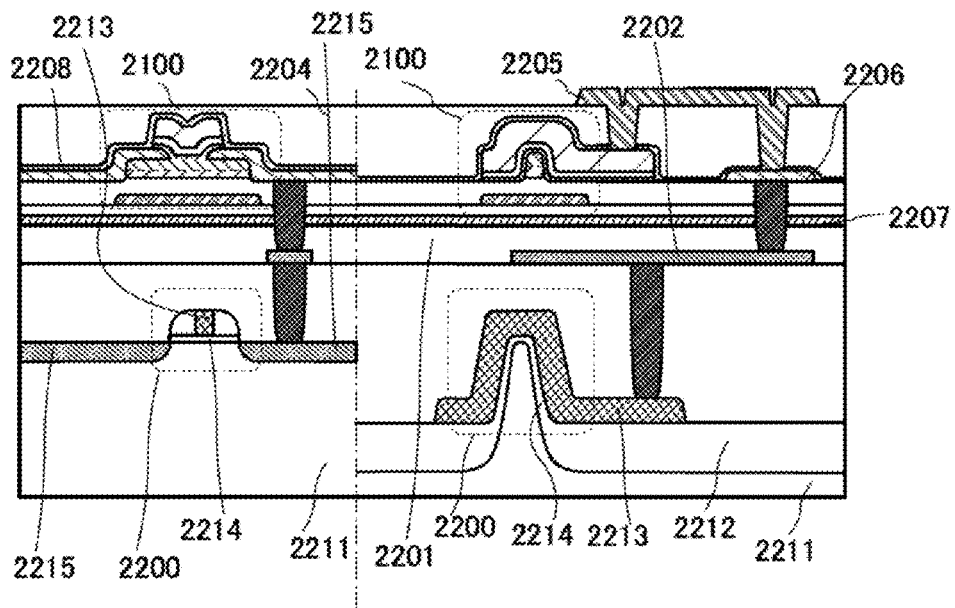

FIG. 30A
FIG. 30B
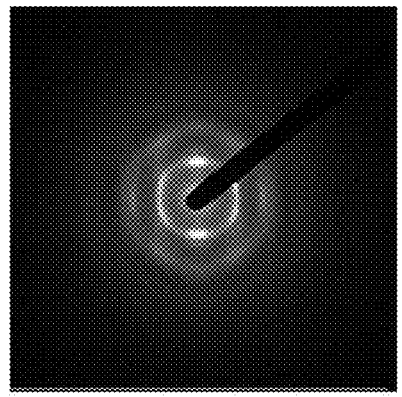 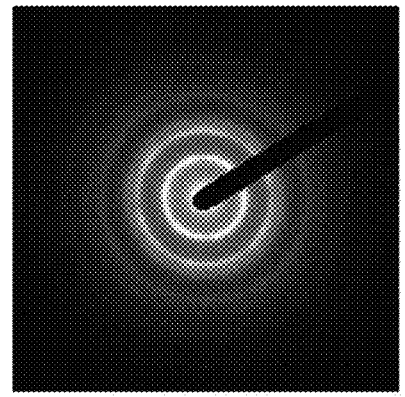

TRANSISTOR WITH CURVED ACTIVE LAYER

BACKGROUND OF THE INVENTION

1. Field of the Invention

The present invention relates to an object, a method, or a manufacturing method. Further, the present invention relates to a process, a machine, manufacture, or a composition of matter. In particular, one embodiment of the present invention relates to a semiconductor device, a display device, a light-emitting device, a memory device, an arithmetic device, an imaging device, a driving method thereof, or a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, or an electronic device includes a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films that can be used for the transistors, silicon-based semiconductor materials have been widely known, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices.

REFERENCE

Patent Document

[Patent Document 1] Japanese Published Patent Application No. 2007-123861
[Patent Document 2] Japanese Published Patent Application No. 2007-96055

SUMMARY OF THE INVENTION

An object of one embodiment of the present invention is to provide a semiconductor device with favorable electrical characteristics. Another object is to provide a semiconductor device that is suitable for miniaturization. Another object is to provide a highly integrated semiconductor device. Another object is to provide a semiconductor device with low power consumption. Another object is to provide a highly reliable semiconductor device. Another object is to provide a semiconductor device which can retain data even when power supply is stopped. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a transistor in which an oxide semiconductor layer is used for a channel formation region and which is characterized by a cross-sectional shape of the oxide semiconductor layer in a channel width (W) direction.

One embodiment of the present invention is a semiconductor device including an insulating layer; a semiconductor layer over the insulating layer; a source electrode layer and a drain electrode layer electrically connected to the semiconductor layer; a gate insulating film over the semiconductor layer, the source electrode layer, and the drain electrode layer; and a gate electrode layer overlapping with the semiconductor layer, part of the source electrode layer, and part of the drain electrode layer with the gate insulating film positioned therebetween. In a cross section of the semiconductor layer in a channel width direction, the semiconductor layer includes a first region of which one end portion is in contact with the insulating layer and which is positioned at one side portion of the semiconductor layer; a second region of which one end portion is in contact with the other end portion of the first region and which is positioned at an upper portion of the semiconductor layer; and a third region of which one end portion is in contact with the other end portion of the second region and the other end portion is in contact with the insulating layer and which is positioned at the other side portion of the semiconductor layer. The first region, the second region, and the third region are in contact with the gate insulating film. In the second region, an interface with the gate insulating film is convex and has a region with a curvature radius R1, a region with a curvature radius R2, and a region with a curvature radius R3 that are connected in this order from the one end portion side toward the other end portion side. In the cross section, R2 is larger than R1 and R3.

Note that in this specification and the like, ordinal numbers such as "first" and "second" are used in order to avoid confusion among components and do not limit the components numerically.

Another embodiment of the present invention is a semiconductor device including an insulating layer; a semiconductor layer over the insulating layer; a source electrode layer and a drain electrode layer electrically connected to the semiconductor layer; a gate insulating film over the semiconductor layer, the source electrode layer, and the drain electrode layer; and a gate electrode layer overlapping with the semiconductor layer, part of the source electrode layer, and part of the drain electrode layer with the gate insulating film positioned therebetween. In a cross section of the semiconductor layer in a channel width direction, the semiconductor layer includes a first region of which one end portion is in contact with the insulating layer and which is positioned at one side portion of the semiconductor layer; a second region of which one end portion is in contact with the other end portion of the first region and which is positioned at an upper portion of the semiconductor layer; and a third region of which one end portion is in contact with the other end portion of the second region and the other end portion is in contact with the insulating layer and which is positioned at the other side portion of the semiconductor layer. The first region, the second region, and the third region are in contact with the gate insulating film. In the second region, an interface with the gate insulating film is convex and has a region with a curvature radius R1, a region with a curvature radius R2, and a region with a curvature radius R3 that are connected in this order from the one end portion side toward the other end portion side.

In the one end portion of the first region, an interface with the gate insulating film is concave with a curvature radius R4. In the other end portion of the third region, an interface with the gate insulating film is concave with a curvature radius R5. In the cross section, R2 is larger than R1 and R3, and R1 and R3 are each larger than R4 and R5.

In the above semiconductor device, R2 is preferably twice or more as large as one of R1 and R3 that is smaller than the other.

Furthermore, R1 and R3 are each preferably three times or more as large as one of R4 and R5 that is smaller than the other.

In addition, R1 divided by R3 and R4 divided by R5 are each preferably greater than or equal to 0.7 and less than or equal to 1.3.

An angle formed by a line coinciding with an interface between the first region and the gate insulating film and extending to the gate electrode layer side and a line coinciding with an interface between the third region and the gate insulating film and extending to the gate electrode layer side is preferably greater than or equal to 5° and less than or equal to 45°.

A height of the semiconductor layer in the cross section in the channel width direction is preferably greater than or equal to 30 nm and less than or equal to 3000 nm.

A height of the semiconductor layer in the cross section in the channel width direction divided by a channel width is preferably greater than or equal to 0.5.

In the above semiconductor device, a conductive layer overlapping with the semiconductor layer with the insulating layer positioned therebetween may be formed.

Furthermore, an oxide semiconductor layer can be used as the semiconductor layer.

The oxide semiconductor layer may be a stack including a first oxide semiconductor layer, a second oxide semiconductor layer, and a third oxide semiconductor layer in this order from the insulating layer side.

It is preferable that the first oxide semiconductor layer, the second oxide semiconductor layer, and the third oxide semiconductor layer each contain an In-M-Zn oxide (M is Al, Ti, Ga, Y, Zr, Sn, La, Ce, Nd, or Hf), and that an atomic ratio of M to In in each of the first oxide semiconductor layer and the third oxide semiconductor layer be higher than an atomic ratio of M to In in the second oxide semiconductor layer.

The oxide semiconductor layer preferably includes a c-axis aligned crystal.

Another embodiment of the present invention is a semiconductor device including an insulating layer; a stack including a first semiconductor layer and a second semiconductor layer in this order over the insulating layer; a source electrode layer and a drain electrode layer electrically connected to part of the stack; a third semiconductor layer covering part of the stack, part of the source electrode layer, and part of the drain electrode layer; and a gate insulating film and a gate electrode layer overlapping with part of the stack, part of the source electrode layer, part of the drain electrode layer, and the third semiconductor layer. In a cross section in a channel width direction of a region where the third semiconductor layer covers the stack, the third semiconductor layer includes a first region covering one side portion of the stack and part of the insulating layer, a second region covering an upper portion of the second semiconductor layer, and a third region covering the other side portion of the stack and part of the insulating layer. In the second region, an interface with the gate insulating film is convex and has a region with a curvature radius R1, a region with a curvature radius R2, and a region with a curvature radius R3 that are connected in this order from the one end portion side toward the other end portion side. In the cross section, R2 is larger than R1 and R3.

Another embodiment of the present invention is a semiconductor device including an insulating layer; a stack including a first semiconductor layer and a second semiconductor layer in this order over the insulating layer; a source electrode layer and a drain electrode layer electrically connected to part of the stack; a third semiconductor layer covering part of the stack, part of the source electrode layer, and part of the drain electrode layer; and a gate insulating film and a gate electrode layer overlapping with part of the stack, part of the source electrode layer, part of the drain electrode layer, and the third semiconductor layer. In a cross section in a channel width direction of a region where the third semiconductor layer covers the stack, the third semiconductor layer includes a first region covering one side portion of the stack and part of the insulating layer, a second region covering an upper portion of the second semiconductor layer, and a third region covering the other side portion of the stack and part of the insulating layer. In the second region, an interface with the gate insulating film is convex and has a region with a curvature radius R1, a region with a curvature radius R2, and a region with a curvature radius R3 that are connected in this order from the one end portion side toward the other end portion side. In a portion of the first region that covers part of the insulating layer, an interface with the gate insulating film is concave with a curvature radius R4. In a portion of the third region that covers part of the insulating layer, an interface with the gate insulating film is concave with a curvature radius R5. In the cross section, R2 is larger than R1 and R3, and R1 and R3 are each larger than R4 and R5.

In the above semiconductor device, R2 is preferably twice or more as large as one of R1 and R3 that is smaller than the other.

Furthermore, R1 and R3 are each preferably three times or more as large as one of R4 and R5 that is smaller than the other.

In addition, R1 divided by R3 and R4 divided by R5 are each preferably greater than or equal to 0.7 and less than or equal to 1.3.

An angle formed by a line coinciding with an interface between the first region and the gate insulating film and extending to the gate electrode layer side and a line coinciding with an interface between the third region and the gate insulating film and extending to the gate electrode layer side is preferably greater than or equal to 5° and less than or equal to 45°.

A total height of the first semiconductor layer, the second semiconductor layer, and the third semiconductor layer in the cross section in the channel width direction is preferably greater than or equal to 30 nm and less than or equal to 3000 nm.

A total height of the first semiconductor layer, the second semiconductor layer, and the third semiconductor layer in the cross section in the channel width direction divided by a channel width is preferably greater than or equal to 0.5.

In the above semiconductor device, a conductive layer overlapping with the first semiconductor layer, the second semiconductor layer, and the third semiconductor layer with the insulating layer positioned therebetween may be formed.

Furthermore, oxide semiconductor layers can be used as the first semiconductor layer, the second semiconductor layer, and the third semiconductor layer.

It is preferable that a first oxide semiconductor layer, a second oxide semiconductor layer, and a third oxide semiconductor layer corresponding to the first semiconductor layer, the second semiconductor layer, and the third semiconductor layer each contain an In-M-Zn oxide (M is Al, Ti, Ga, Y, Zr, Sn, La, Ce, Nd, or Hf), and that an atomic ratio of M to In in each of the first oxide semiconductor layer and the third oxide semiconductor layer be higher than an atomic ratio of M to In in the second oxide semiconductor layer.

The first oxide semiconductor layer, the second oxide semiconductor layer, and the third oxide semiconductor layer each preferably include a c-axis aligned crystal.

A length in a channel length direction of a region of the gate electrode layer that overlaps with part of the source electrode layer or part of the drain electrode layer is preferably greater than or equal to 3 nm and less than 300 nm.

According to one embodiment of the present invention, a semiconductor device with favorable electrical characteristics can be provided. A semiconductor device that is suitable for miniaturization can be provided. A highly integrated semiconductor device can be provided. A semiconductor device with low power consumption can be provided. A highly reliable semiconductor device can be provided. A semiconductor device which can retain data even when power supply is stopped can be provided. A novel semiconductor device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 16A to 16D are Cs-corrected high-resolution TEM images of a plane of a CAAC-OS.

FIGS. 18A to 18D are cross-sectional views and circuit diagrams of semiconductor devices.

FIGS. 30A and 30B show electron diffraction patterns of a CAAC-OS.

DETAILED DESCRIPTION OF THE INVENTION

Figure 1A:
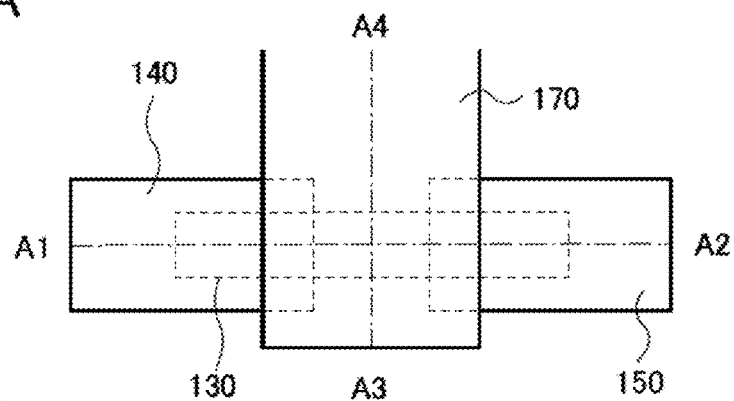
FIGS. 1A to 1C are a top view and cross-sectional views illustrating a transistor.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not construed as being limited to the description of the embodiments below. Note that in the structures of the present invention described below, the same portions or portions having similar functions are denoted by the same reference numerals in different drawings, and the description thereof is not repeated in some cases. It is also to be noted that the same components are denoted by different hatching patterns in different drawings, or the hatching patterns are omitted in some cases.

For example, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is disclosed in this specification and the like.

Here, X and Y each denote an object (e.g., a device, an element, a circuit, a wiring, an electrode, a terminal, a conductive film, or a layer).

For example, in the case where X and Y are directly connected, X and Y are connected without an element that enables electrical connection between X and Y (e.g., a switch, a transistor, a capacitor, an inductor, a resistor, a diode, a display element, a light-emitting element, or a load) interposed between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and X and Y are electrically connected.

Note that in this specification and the like, an explicit description "X and Y are connected" means that X and Y are electrically connected (i.e., the case where X and Y are connected with another element or circuit provided therebetween), X and Y are functionally connected (i.e., the case where X and Y are functionally connected with another circuit provided therebetween), and X and Y are directly connected (i.e., the case where X and Y are connected without another element or circuit provided therebetween). That is, in this specification and the like, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a semiconductor device of one embodiment of the present invention is described with reference to drawings.

In a transistor of one embodiment of the present invention, silicon (including strained silicon), germanium, silicon germanium, silicon carbide, gallium arsenide, aluminum gallium arsenide, indium phosphide, gallium nitride, an organic semiconductor, an oxide semiconductor, or the like can be used for a channel formation region. It is particularly preferable to use an oxide semiconductor having a wider band gap than silicon for the channel formation region.

For example, the oxide semiconductor preferably contains at least indium (In) or zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

In the description below, unless otherwise specified, a semiconductor device described as an example includes an oxide semiconductor in a channel formation region.

Figure 1B:
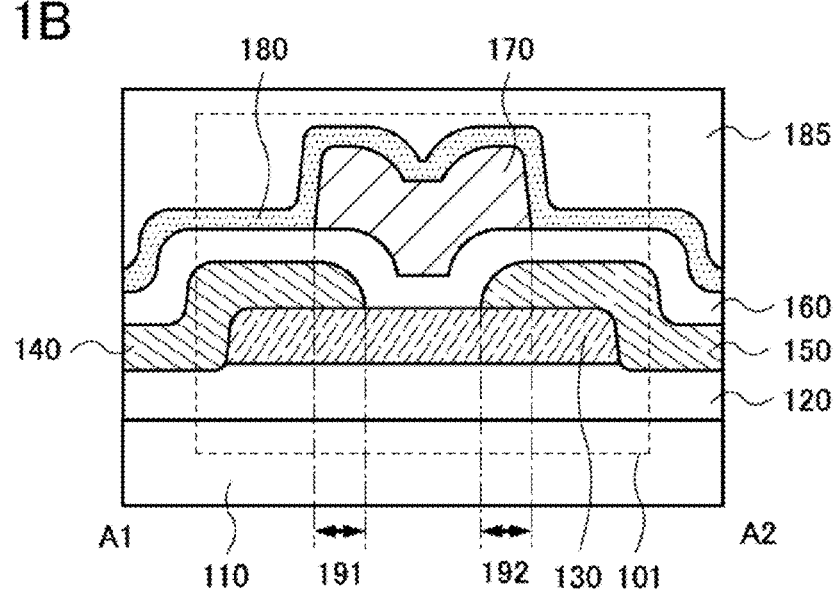
Figure 1C:
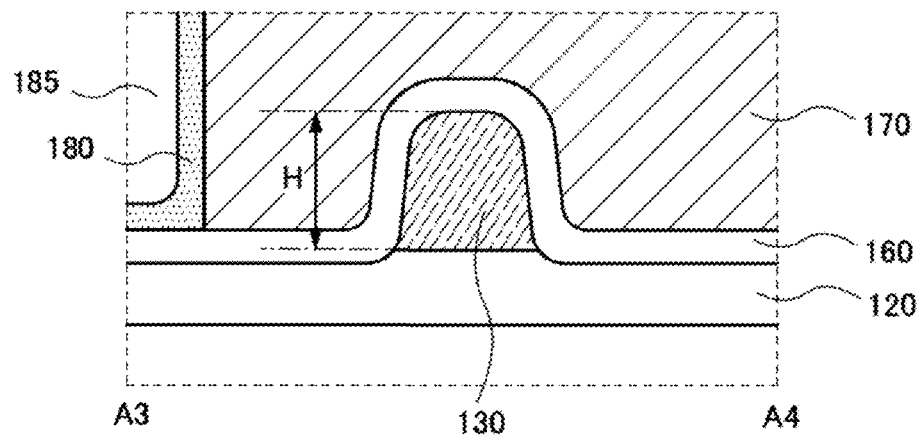

FIGS. 1A to 1C are a top view and cross-sectional views of a transistor 101 of one embodiment of the present invention. FIG. 1A is the top view. FIG. 1B illustrates a cross section in the direction of a dashed-dotted line A1-A2 in FIG. 1A. FIG. 1C illustrates a cross section in the direction of a dashed-dotted line A3-A4 in FIG. 1A. In FIGS. 1A to 1C, some components are enlarged, reduced in size, or omitted for easy understanding. In some cases, the direction of the dashed-dotted line A1-A2 is referred to as a channel length direction, and the direction of the dashed-dotted line A3-A4 is referred to as a channel width direction.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

The transistor 101 includes an insulating layer 120 over a substrate 110; an oxide semiconductor layer 130 over the insulating layer 120; a source electrode layer 140 and a drain electrode layer 150 electrically connected to the oxide semiconductor layer 130; a gate insulating film 160 over the oxide semiconductor layer 130, the source electrode layer 140, and the drain electrode layer 150; and a gate electrode layer 170 overlapping with the oxide semiconductor layer 130, part of the source electrode layer 140, and part of the drain electrode layer 150 with the gate insulating film 160 provided therebetween. In addition, an insulating layer 180 may be provided over the gate insulating film 160 and the gate electrode layer 170. Further, an insulating layer 185 formed using an oxide may be formed over the insulating layer 180. The insulating layers may be provided as needed and another insulating layer may be further provided thereover.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that at least part (or the whole) of the source electrode layer 140 (and/or the drain electrode layer 150) is provided on at least part (or the whole) of a surface, a side surface, a top surface, and/or a bottom surface of a semiconductor layer such as the oxide semiconductor layer 130.

Alternatively, at least part (or the whole) of the source electrode layer 140 (and/or the drain electrode layer 150) is in contact with at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is in contact with at least part (or the whole) of a semiconductor layer such as the oxide semiconductor layer 130.

Alternatively, at least part (or the whole) of the source electrode layer 140 (and/or the drain electrode layer 150) is electrically connected to at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is electrically connected to at least part (or the whole) of a semiconductor layer such as the oxide semiconductor layer 130.

Alternatively, at least part (or the whole) of the source electrode layer 140 (and/or the drain electrode layer 150) is provided near at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided near at least part (or the whole) of a semiconductor layer such as the oxide semiconductor layer 130.

Alternatively, at least part (or the whole) of the source electrode layer 140 (and/or the drain electrode layer 150) is provided next to at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided next to at least part (or the whole) of a semiconductor layer such as the oxide semiconductor layer 130.

Alternatively, at least part (or the whole) of the source electrode layer 140 (and/or the drain electrode layer 150) is provided obliquely above at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided obliquely above at least part (or the whole) of a semiconductor layer such as the oxide semiconductor layer 130.

Alternatively, at least part (or the whole) of the source electrode layer 140 (and/or the drain electrode layer 150) is provided above at least part (or the whole) of a surface, a side surface, a top surface, and/or a bottom surface of a semiconductor layer such as the oxide semiconductor layer 130. Alternatively, at least part (or the whole) of the source electrode layer 140 (and/or the drain electrode layer 150) is provided above at least part (or the whole) of a semiconductor layer such as the oxide semiconductor layer 130.

The transistor of one embodiment of the present invention has a top-gate structure with a channel length greater than or equal to 10 nm and less than or equal to 300 nm. The transistor includes a region 191 (LovS) where the gate electrode layer 170 overlaps with the source electrode layer 140 and a region 192 (LovD) where the gate electrode layer 170 overlaps with the drain electrode layer 150. To reduce parasitic capacitance, the width of each of the regions 191 and 192 in the channel length direction is preferably greater than or equal to 3 nm and less 300 nm.

Figure 2A:
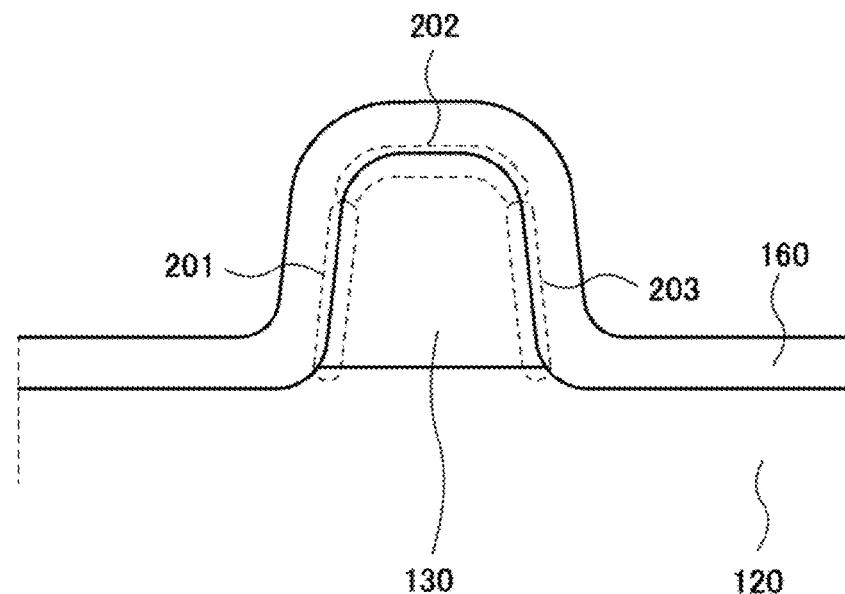
FIGS. 2A and 2B each illustrate a cross section of a transistor in a channel width direction.

FIG. 2A is an enlarged view showing some components of the transistor 101 in the cross section in the channel width direction shown in FIG. 1C. In the cross section, the oxide semiconductor layer 130 includes a first region 201 of which one end portion is in contact with the insulating layer 120, a second region 202 of which one end portion is in contact with the other end portion of the first region 201, and a third region 203 of which one end portion is in contact with the other end portion of the second region 202 and the other end portion is in contact with the insulating layer 120. The second region 202 is positioned at an upper portion of the oxide semiconductor layer 130.

Figure 2B:
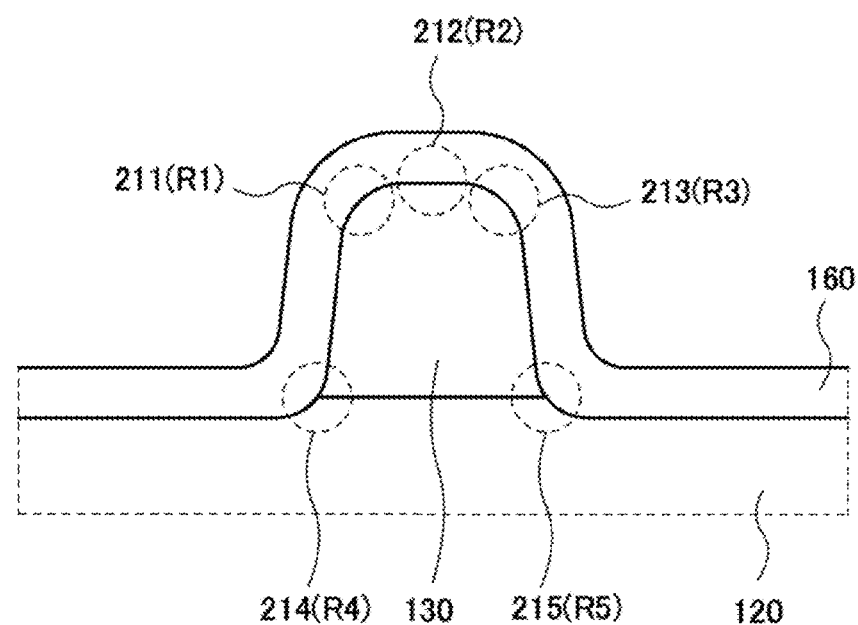

As shown in FIG. 2B, in the second region 202, the interface with the gate insulating film 160 is convex and has a region 211 with a curvature radius R1, a region 212 with a curvature radius R2, and a region 213 with a curvature radius R3 that are connected in this order from the one end portion side toward the other end portion side of the second region 202.

Furthermore, in the one end portion of the first region 201, there is a concave region 214 with a curvature radius R4 at the interface with the gate insulating film 160. In the other end portion of the third region 203, there is a concave region 215 with a curvature radius R5 at the interface with the gate insulating film 160. Note that concave regions of the insulating layer 120 may be taken into account when the curvature radii of the region 214 and the region 215 are calculated.

Figure 3:
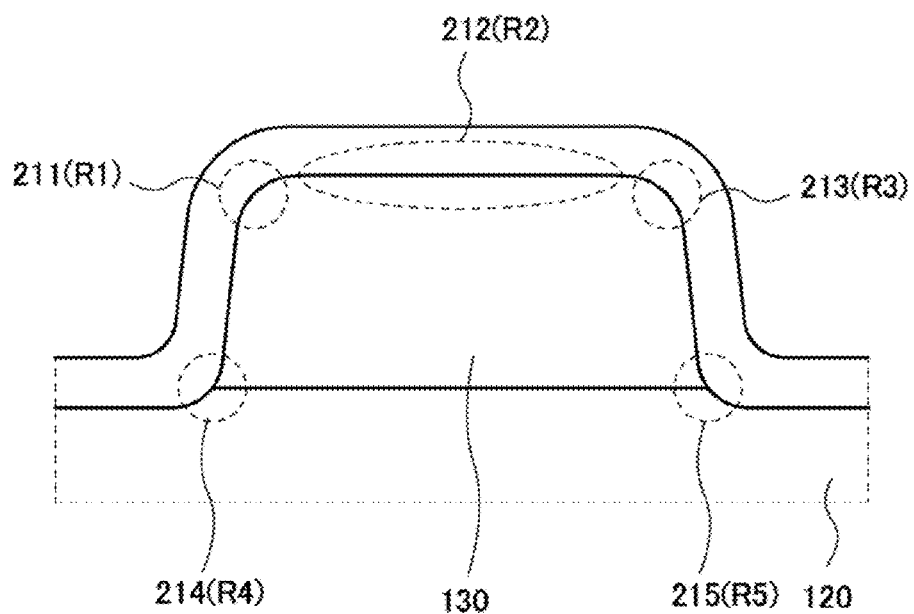
FIG. 3 illustrates a cross section of a transistor in a channel width direction.

Here, R2 is preferably larger than R1 and R3, further preferably twice or more as large as the smaller one of R1 and R3. Furthermore, R1 and R3 are preferably substantially equal to each other; R1/R3 is preferably greater than or equal to 0.7 and less than or equal to 1.3. Furthermore, R4 and R5 are preferably substantially equal to each other; R4/R5 is preferably greater than or equal to 0.7 and less than or equal to 1.3. In addition, R1 and R3 are each preferably larger than R4 and R5, further preferably three times or more as large as the smaller one of R4 and R5. Note that in the case where the channel width is large, R2 is infinite and the region 212 is substantially flat, as shown in FIG. 3.

Figure 4:
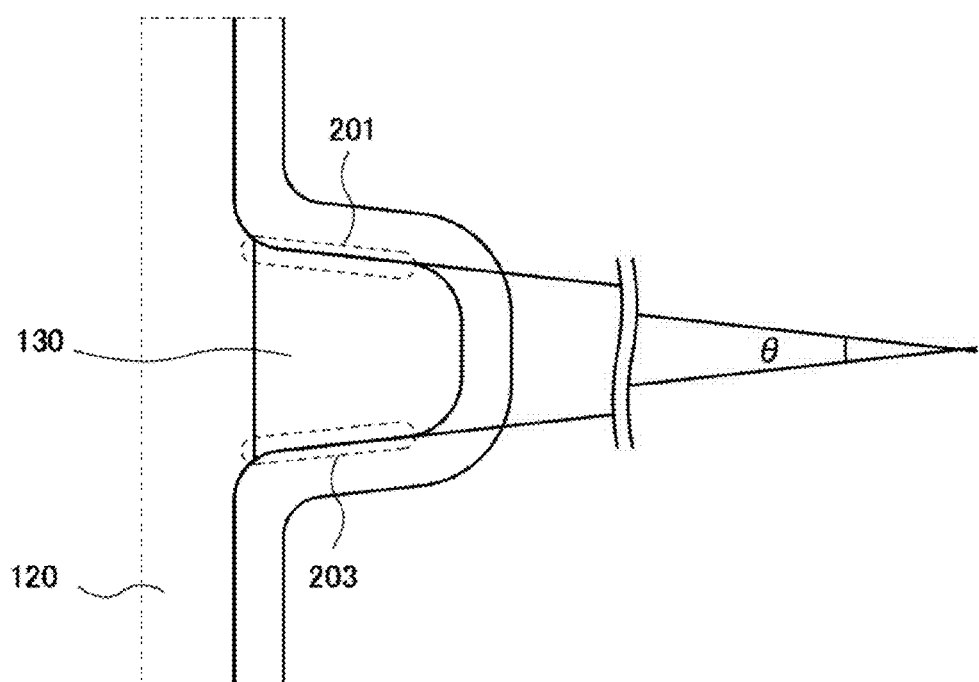
FIG. 4 illustrates a cross section of a transistor in a channel width direction.

Furthermore, as shown in FIG. 4, an angle θ that is formed by a line coinciding with the interface between the first region 201 and the gate insulating film 160 and extending to the gate electrode layer 170 side and a line coinciding with the interface between the third region 203 and the gate insulating film 160 and extending to the gate electrode layer 170 side is greater than or equal to 5° and less than or equal to 45°, preferably greater than or equal to 8° and less than or equal to 30°, further preferably greater than or equal to 10° and less than or equal to 25°.

The height (H) of the oxide semiconductor layer 130 in the cross section in the channel width direction is preferably greater than or equal to 30 nm and less than or equal to 3000 nm, and can be 100 nm to 200 nm, for example. Note that the height (H) may include the height of a projecting portion of the insulating layer 120 formed by over-etching.

In addition, the height of the oxide semiconductor layer 130 in the cross section in the channel width direction divided by the channel width is 0.5 or more, preferably 5 to 10, for example.

The above-described structure improves the coverage of the oxide semiconductor layer 130 with the gate insulating film 160; thus, the gate insulating film 160 can be easily made thin. Moreover, the oxide semiconductor layer 130 without a local convex or concave portion where an electric field concentrates can be obtained; thus, a transistor with high gate withstand voltage can be formed.

Figure 5:
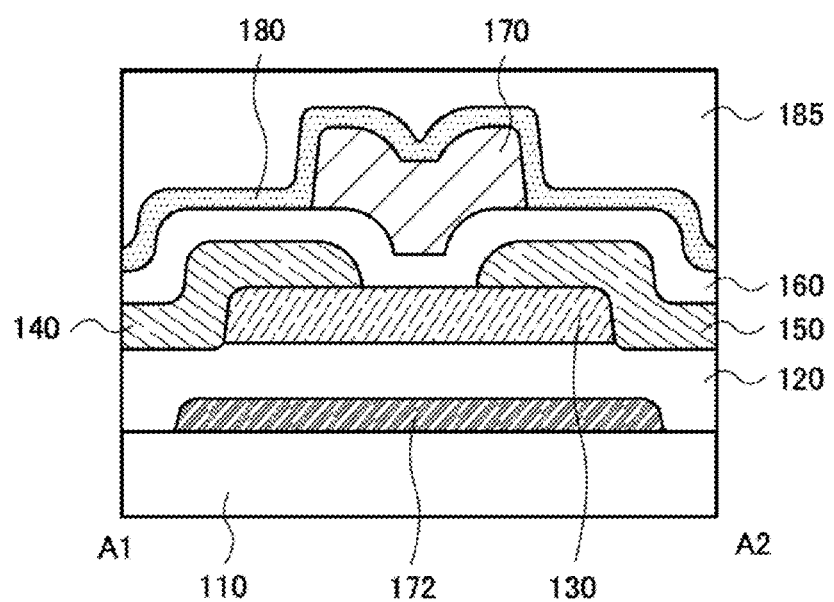
FIG. 5 is a cross-sectional view illustrating a transistor.

The transistor 101 may include a conductive film 172 between the oxide semiconductor layer 130 and the substrate 110 as shown in FIG. 5. When the conductive film is used as a second gate electrode (back gate), the on-state current can be increased or the threshold voltage can be controlled. In order to increase the on-state current, for example, the gate electrode layer 170 and the conductive film 172 are set to have the same potential, and the transistor is driven as a dual-gate transistor. Further, to control the threshold voltage, a fixed potential, which is different from a potential of the gate electrode layer 170, is supplied to the conductive film 172.

Figure 6A:
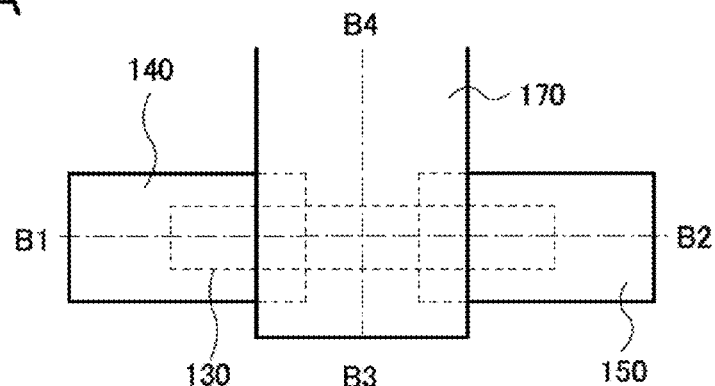
FIGS. 6A to 6C are a top view and cross-sectional views illustrating a transistor.
Figure 6B:
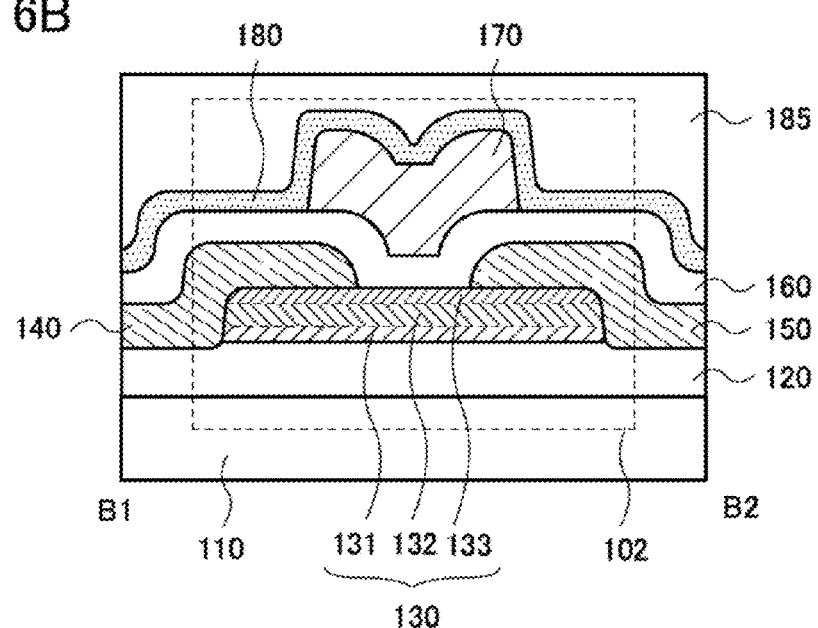
Figure 6C:
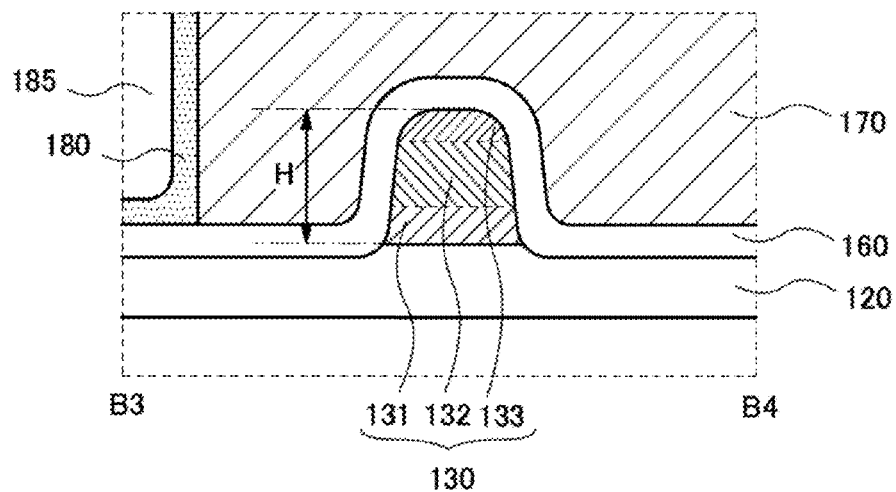

The transistor of one embodiment of the present invention may have a structure illustrated in FIGS. 6A to 6C. FIG. 6A is a top view. FIG. 6B illustrates a cross section in the direction of a dashed-dotted line B1-B2 in FIG. 6A. FIG. 6C illustrates a cross section in the direction of a dashed-dotted line B3-B4 in FIG. 6A. In FIGS. 6A to 6C, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

A transistor 102 shown in FIGS. 6A to 6C differs from the transistor 101 in that a first oxide semiconductor layer 131, a second oxide semiconductor layer 132, and a third oxide semiconductor layer 133 are formed, as the oxide semiconductor layer 130, in this order from the insulating layer 120 side.

Oxide semiconductor layers with different compositions, for example, can be used as the first oxide semiconductor layer 131, the second oxide semiconductor layer 132, and the third oxide semiconductor layer 133.

Note that the description on the shape of the oxide semiconductor layer 130 in the transistor 101 can also be applied to the transistor 102 and the shape can produce a similar effect. It is also possible to apply the structure shown in FIG. 5 to the transistor 102.

Figure 7A:
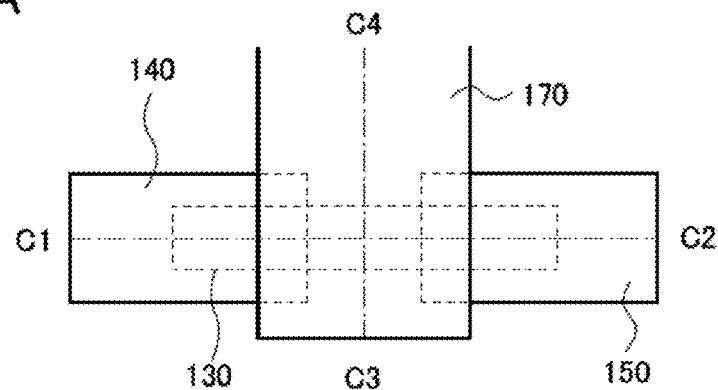
FIGS. 7A to 7C are a top view and cross-sectional views illustrating a transistor.
Figure 7B:
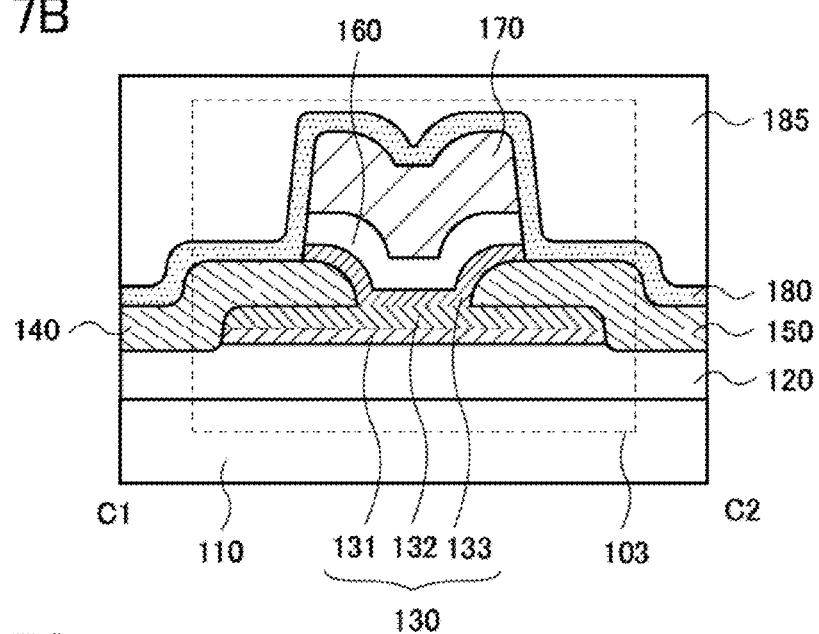
Figure 7C:
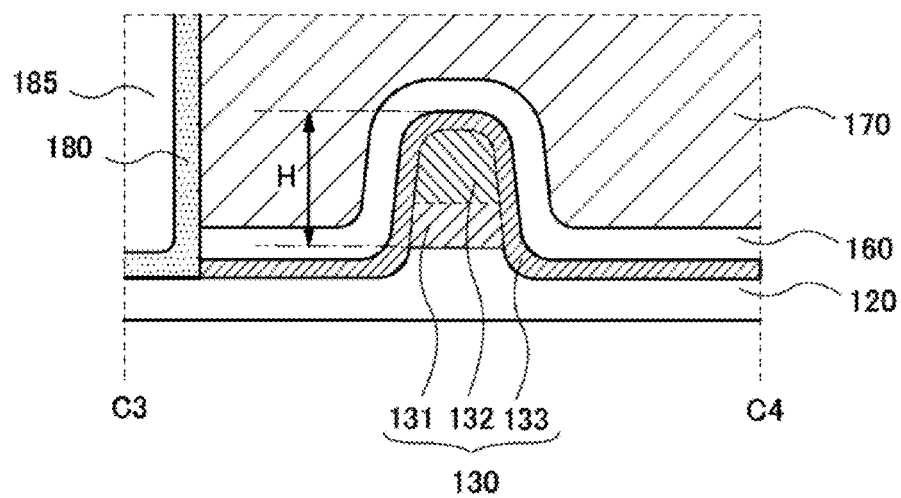

The transistor of one embodiment of the present invention may have a structure illustrated in FIGS. 7A to 7C. FIG. 7A is a top view. FIG. 7B illustrates a cross section in the direction of a dashed-dotted line C1-C2 in FIG. 7A. FIG. 7C illustrates a cross section in the direction of a dashed-dotted line C3-C4 in FIG. 7A. In FIGS. 7A to 7C, some components are enlarged, reduced in size, or omitted for easy understanding. In some cases, the direction of the dashed-dotted line C1-C2 is referred to as a channel length direction, and the direction of the dashed-dotted line C3-C4 is referred to as a channel width direction.

A transistor 103 shown in FIGS. 7A to 7C differs from the transistor 101 and the transistor 102 in that the oxide semiconductor layer 130 includes a stack in which the first oxide semiconductor layer 131 and the second oxide semiconductor layer 132 are formed in this order from the insulating layer 120 side and the third oxide semiconductor layer 133 covering part of the stack.

Oxide semiconductor layers with different compositions, for example, can be used as the first oxide semiconductor layer 131, the second oxide semiconductor layer 132, and the third oxide semiconductor layer 133.

Specifically, the transistor 103 includes the insulating layer 120 over the substrate 110; the stack in which the first oxide semiconductor layer 131 and the second oxide semiconductor layer 132 are formed in this order over the insulating layer 120; the source electrode layer 140 and the drain electrode layer 150 electrically connected to part of the stack; the third oxide semiconductor layer 133 covering part of the stack, part of the source electrode layer 140, and part of the drain electrode layer 150; and the gate insulating film 160 and the gate electrode layer 170 overlapping with part of the stack, part of the source electrode layer 140, part of the drain electrode layer 150, and the third oxide semiconductor layer 133. The insulating layer 180 may be provided over the source electrode layer 140, the drain electrode layer 150, and the gate electrode layer 170. Further, the insulating layer 185 formed using an oxide may be formed over the insulating layer 180. The insulating layers may be provided as needed and another insulating layer may be further provided thereover.

Figure 8A:
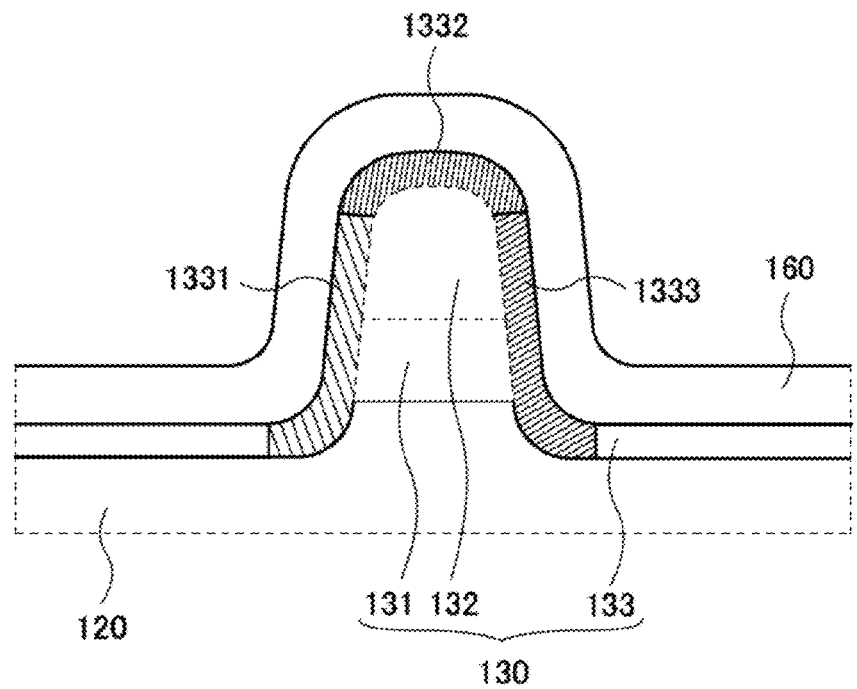
FIGS. 8A and 8B each illustrate a cross section of a transistor in a channel width direction.

FIG. 8A is an enlarged view showing some components of the transistor 103 in the cross section in the channel width direction shown in FIG. 7C. In the cross section, the third oxide semiconductor layer 133 includes a first region 1331 covering one side portion of the stack including the first oxide semiconductor layer 131 and the second oxide semiconductor layer 132 and part of the insulating layer 120; a second region 1332 covering an upper portion of the second oxide semiconductor layer 132; and a third region 1333 covering the other side portion of the stack and part of the insulating layer 120.

Figure 8B:
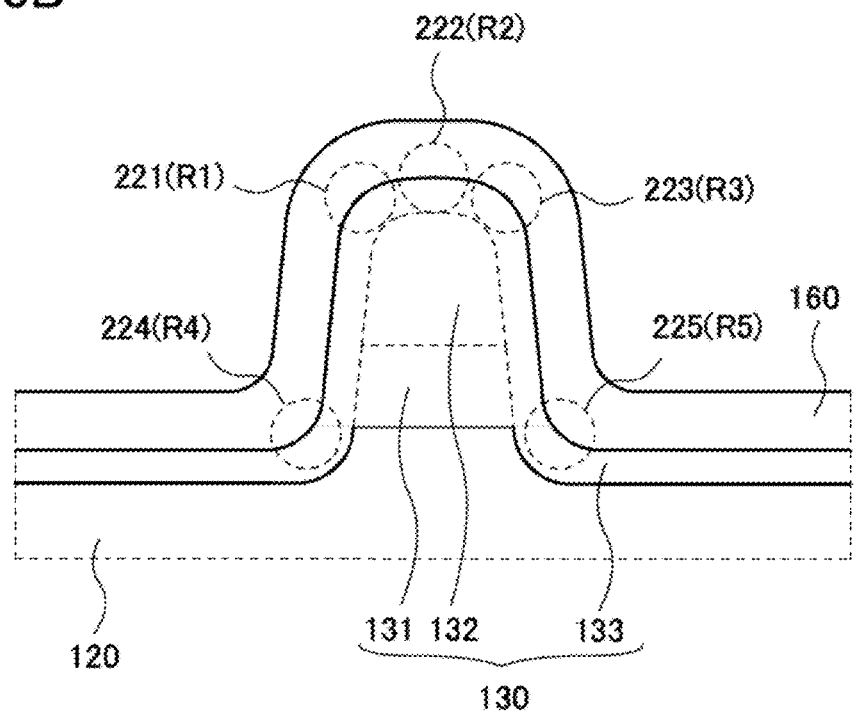

As shown in FIG. 8B, in the second region 1332, the interface with the gate insulating film 160 is convex and has a region 221 with a curvature radius R1, a region 222 with a curvature radius R2, and a region 223 with a curvature radius R3 that are connected in this order from the one end portion side toward the other end portion side of the second region 1332.

Furthermore, in the one end portion of the first region 1331, there is a concave region 224 with a curvature radius R4 at the interface with the gate insulating film 160. In the other end portion of the third region 1333, there is a concave region 225 with a curvature radius R5 at the interface with the gate insulating film 160.

Here, R2 is preferably larger than R1 and R3, further preferably twice or more as large as the smaller one of R1 and R3. Furthermore, R1 and R3 are preferably substantially equal to each other; R1/R3 is preferably greater than or equal to 0.7 and less than or equal to 1.3. Furthermore, R4 and R5 are preferably substantially equal to each other; R4/R5 is preferably greater than or equal to 0.7 and less than or equal to 1.3. In addition, R1 and R3 are each preferably larger than R4 and R5, further preferably three times or more as large as the smaller one of R4 and R5. Note that in the case where the channel width is large, R2 is infinite and the region 222 is substantially flat, as in the transistor shown in FIG. 3.

Figure 9:
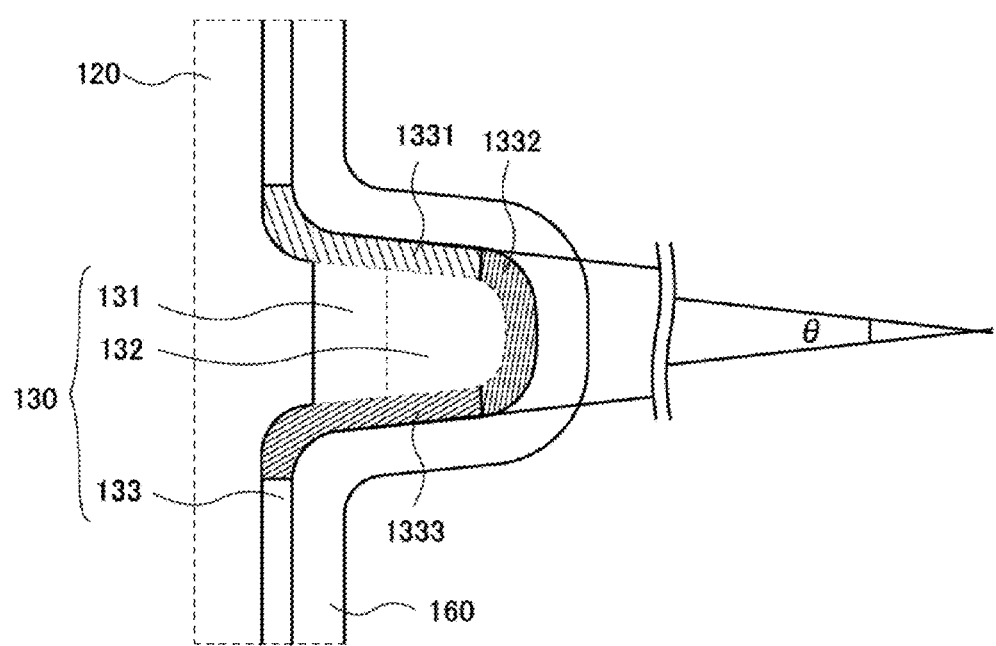
FIG. 9 illustrates a cross section of a transistor in a channel width direction.

Furthermore, as shown in FIG. 9, an angle $\theta$ that is formed by a line coinciding with the interface between the first region 1331 and the gate insulating film 160 and extending to the gate electrode layer 170 side and a line coinciding with the interface between the third region 1333 and the gate insulating film 160 and extending to the gate electrode layer 170 side is greater than or equal to 5° and less than or equal to 45°, preferably greater than or equal to 8° and less than or equal to 30°, further preferably greater than or equal to 10° and less than or equal to 25°.

The height (H) of the oxide semiconductor layer 130 in the cross section in the channel width direction is preferably greater than or equal to 30 nm and less than or equal to 3000 nm, and can be 100 nm to 200 nm, for example. Note that the height (H) may include the height of a projecting portion formed by over-etching of the insulating layer 120.

In addition, the height of the oxide semiconductor layer 130 in the cross section in the channel width direction divided by the channel width is 0.5 or more, preferably 5 to 10, for example.

The above-described structure improves the coverage of the oxide semiconductor layer 130 with the gate insulating film 160; thus, the gate insulating film 160 can be easily made thin. Moreover, the oxide semiconductor layer 130 without a local convex or concave portion where an electric field concentrates can be obtained; thus, a transistor with high gate withstand voltage can be formed.

Figure 10:
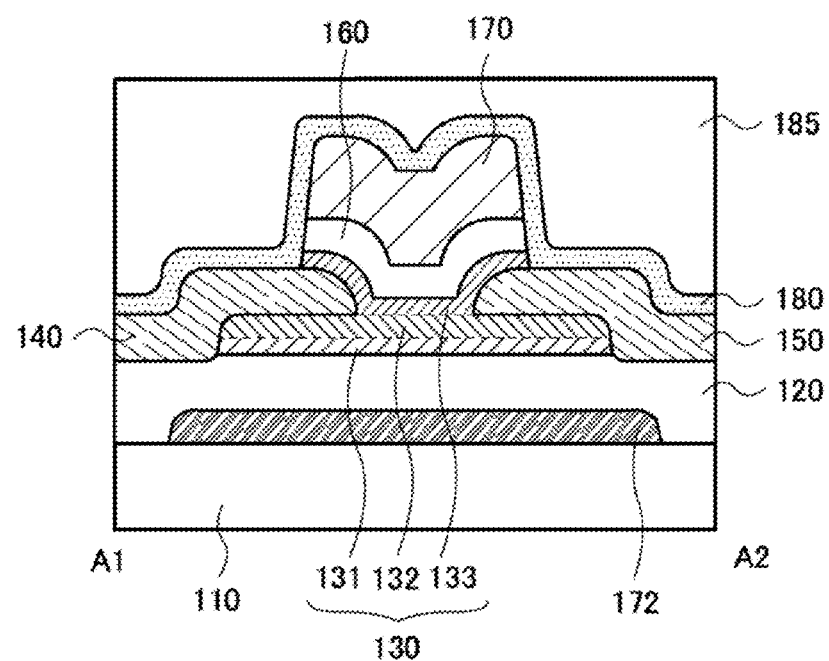
FIG. 10 is a cross-sectional view illustrating a transistor.

The transistor 103 may include a conductive film 172 between the oxide semiconductor layer 130 and the substrate 110 as shown in FIG. 10. When the conductive film is used as a second gate electrode (back gate), the on-state current can be increased or the threshold voltage can be controlled. In order to increase the on-state current, for example, the gate electrode layer 170 and the conductive film 172 are set to have the same potential, and the transistor is driven as a dual-gate transistor. Further, to control the threshold voltage, a fixed potential, which is different from a potential of the gate electrode layer 170, is supplied to the conductive film 172.

In the transistor 101 in FIGS. 1A to 1C, in the channel formation region, the oxide semiconductor layer 130 is a single layer. In the transistor 102 in FIGS. 6A to 6C, in the channel formation region, the oxide semiconductor layer 130 has a three-layer structure in which the first oxide semiconductor layer 131, the second oxide semiconductor layer 132, and the third oxide semiconductor layer 133 are stacked in this order from the substrate 110 side. As in the transistor 102, the oxide semiconductor layer 130 in the transistor 103 in FIGS. 7A to 7C has a three-layer structure. In the channel formation region of the transistor 103, the second oxide semiconductor layer 132 is surrounded by the first oxide semiconductor layer 131 and the third oxide semiconductor layer 133.

In each of the above structures, the gate electrode layer 170 electrically surrounds the oxide semiconductor layer 130 in the channel width direction. This structure increases the on-state current. Such a transistor structure is referred to as a surrounded channel (s-channel) structure. In each of the structures of the transistor 102 and the transistor 103, selecting appropriate materials for the three layers forming the oxide semiconductor layer 130 allows current to flow in the whole of the second oxide semiconductor layer 132. Since current flows in the second oxide semiconductor layer 132 in an inner part of the oxide semiconductor layer 130, the current is hardly influenced by interface scattering, leading to a high on-state current. Note that increasing the thickness of the second oxide semiconductor layer 132 can increase the on-state current. The thickness of the second oxide semiconductor layer 132 may be, for example, 100 nm to 200 nm.

Next, the components of the transistor of one embodiment of the present invention will be described in detail.

The substrate 110 is not limited to a simple supporting substrate, and may be a substrate where another device such as a transistor is formed. In that case, at least one of the gate electrode layer 170, the source electrode layer 140, and the drain electrode layer 150 of the transistor may be electrically connected to the above device.

The insulating layer 120 can have a function of supplying oxygen to the oxide semiconductor layer 130 as well as a function of preventing diffusion of impurities from the substrate 110. For this reason, the insulating layer 120 is preferably an insulating film containing oxygen and further preferably, the insulating layer 120 is an insulating film containing oxygen in which the oxygen content is higher than that in the stoichiometric composition. For example, the insulating layer 120 is a film of which the amount of released oxygen converted into oxygen atoms is $1.0 \times 10^{19}$ atoms/cm$^3$ or more in TDS analysis. The temperature of the film surface in the TDS analysis is higher than or equal to 100° C. and lower than or equal to 700° C., or higher than or equal to 100° C. and lower than or equal to 500° C. In the case where the substrate 110 is provided with another device as described above, the insulating layer 120 also has a function as an interlayer insulating film. In that case, the insulating layer 120 is preferably subjected to planarization treatment such as chemical mechanical polishing (CMP) treatment so as to have a flat surface.

In this embodiment, detailed description is given mainly on the case where the oxide semiconductor layer 130 has a three-layer structure; however, there is no limitation on the number of stacked layers. In the case where the oxide semiconductor layer 130 is a single layer as in the transistor 101, a layer corresponding to the second oxide semiconductor layer 132 described in this embodiment is used. In the case where the oxide semiconductor layer 130 has a two-layer structure, for example, a structure of the oxide semiconductor layer 130 in the transistor 102 or the transistor 103 without the third oxide semiconductor layer 133 is employed. In such a case, the second oxide semiconductor layer 132 and the first oxide semiconductor layer 131 can be replaced with each other. In the case where the oxide semiconductor layer 130 has a stacked-layer structure of four or more layers, for example, a structure in which another oxide semiconductor layer is stacked over the three-layer stack described in this embodiment or a structure in which another oxide semiconductor layer is inserted in any one of the interfaces in the three-layer stack can be employed.

For the second oxide semiconductor layer 132, for example, an oxide semiconductor whose electron affinity (an energy difference between a vacuum level and the conduction band minimum) is higher than those of the first oxide semiconductor layer 131 and the third oxide semiconductor layer 133 is used. The electron affinity can be obtained by subtracting an energy difference between the conduction band minimum and the valence band maximum (what is called an energy gap) from an energy difference between the vacuum level and the valence band maximum (what is called an ionization potential).

The first oxide semiconductor layer 131 and the third oxide semiconductor layer 133 each contain one or more kinds of metal elements contained in the second oxide semiconductor layer 132. For example, the first oxide semiconductor layer 131 and the third oxide semiconductor layer 133 are preferably formed using an oxide semiconductor whose conduction band minimum is closer to a vacuum level than that of the second oxide semiconductor layer 132 by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the gate electrode layer 170, a channel is formed in the second oxide semiconductor layer 132 whose conduction band minimum is the lowest in the oxide semiconductor layer 130.

Further, since the first oxide semiconductor layer 131 contains one or more kinds of metal elements contained in the second oxide semiconductor layer 132, an interface state is unlikely to be formed at the interface between the second oxide semiconductor layer 132 and the first oxide semiconductor layer 131, compared with the interface between the second oxide semiconductor layer 132 and the insulating layer 120 on the assumption that the second oxide semiconductor layer 132 is in contact with the insulating layer 120. The interface state sometimes forms a channel; therefore, the threshold voltage of the transistor is changed in some cases. Thus, with the first oxide semiconductor layer 131, fluctuations in electrical characteristics of the transistor, such as a threshold voltage, can be reduced. Further, the reliability of the transistor can be improved.

Furthermore, since the third oxide semiconductor layer 133 contains one or more kinds of metal elements contained in the second oxide semiconductor layer 132, scattering of carriers is unlikely to occur at the interface between the second oxide semiconductor layer 132 and the third oxide semiconductor layer 133, compared with the interface between the second oxide semiconductor layer 132 and the gate insulating film 160 on the assumption that the second oxide semiconductor layer 132 is in contact with the gate insulating film 160. Thus, with the third oxide semiconductor layer 133, the field-effect mobility of the transistor can be increased.

For the first oxide semiconductor layer 131 and the third oxide semiconductor layer 133, for example, a material containing Al, Ti, Ga, Ge, Y, Zr, Sn, La, Ce, or Hf with a higher atomic ratio than that used for the second oxide semiconductor layer 132 can be used. Specifically, an atomic ratio of any of the above metal elements in the first oxide semiconductor layer 131 and the third oxide semiconductor layer 133 is 1.5 times or more, preferably 2 times or more, further preferably 3 times or more as much as that in the second oxide semiconductor layer 132. Any of the above metal elements is strongly bonded to oxygen and thus has a function of suppressing generation of an oxygen vacancy in the first oxide semiconductor layer 131 and the third oxide semiconductor layer 133. That is, an oxygen vacancy is less likely to be generated in the first oxide semiconductor layer 131 and the third oxide semiconductor layer 133 than in the second oxide semiconductor layer 132.

Note that when each of the first oxide semiconductor layer 131, the second oxide semiconductor layer 132, and the third oxide semiconductor layer 133 is an In-M-Zn oxide containing at least indium, zinc, and M (M is a metal such as Al, Ti, Ga, Ge, Y, Zr, Sn, La, Ce, or Hf), and the first oxide semiconductor layer 131 has an atomic ratio of In to M and Zn which is $x_1:y_1:z_1$, the second oxide semiconductor layer 132 has an atomic ratio of In to M and Zn which is $x_2:y_2:z_2$, and the third oxide semiconductor layer 133 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more, preferably 2 times or more, further preferably 3 times or more as large as $y_2/x_2$. At this time, when $y_2$ is greater than or equal to $x_2$ in the second oxide semiconductor layer 132, the transistor can have stable electrical characteristics. However, when $y_2$ is 3 times or more as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the first oxide semiconductor layer 131 and the third oxide semiconductor layer 133 are preferably less than 50 atomic % and greater than or equal to 50 atomic %, respectively, further preferably less than 25 atomic % and greater than or equal to 75 atomic %, respectively. Further, in the case where Zn and O are not taken into consideration, the proportion of In and the proportion of M in the second oxide semiconductor layer 132 are preferably greater than or equal to 25 atomic % and less than 75 atomic %, respectively, further preferably greater than or equal to 34 atomic % and less than 66 atomic %, respectively.

The thicknesses of the first oxide semiconductor layer 131 and the third oxide semiconductor layer 133 are each greater than or equal to 3 nm and less than or equal to 100 nm, preferably greater than or equal to 3 nm and less than or equal to 50 nm. The thickness of the second oxide semiconductor layer 132 is greater than or equal to 3 nm and less than or equal to 200 nm, preferably greater than or equal to 3 nm and less than or equal to 100 nm, further preferably greater than or equal to 3 nm and less than or equal to 50 nm. In addition, the second oxide semiconductor layer 132 is preferably thicker than the first oxide semiconductor layer 131 and the third oxide semiconductor layer 133.

Note that in order that a transistor in which an oxide semiconductor layer serves as a channel have stable electrical characteristics, it is effective to reduce the concentration of impurities in the oxide semiconductor layer to make the oxide semiconductor layer intrinsic or substantially intrinsic. The term "substantially intrinsic" refers to the state where an oxide semiconductor layer has a carrier density lower than $1\times10^{17}/cm^3$, preferably lower than $1\times10^{15}/cm^3$, further preferably lower than $1\times10^{13}/cm^3$.

In the oxide semiconductor layer, hydrogen, nitrogen, carbon, silicon, and a metal element other than main components of the oxide semiconductor layer are impurities. For example, hydrogen and nitrogen form donor levels to increase the carrier density. In addition, silicon in the oxide semiconductor layer forms an impurity level. The impurity level serves as a trap and might cause deterioration of electrical characteristics of the transistor. Accordingly, in the first oxide semiconductor layer 131, the second oxide semiconductor layer 132, and the third oxide semiconductor layer 133 and at interfaces between these layers, the impurity concentration is preferably reduced.

In order to make the oxide semiconductor layer intrinsic or substantially intrinsic, in secondary ion mass spectrometry (SIMS), for example, the concentration of silicon at a certain depth of the oxide semiconductor layer or in a region of the oxide semiconductor layer is lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of hydrogen at a certain depth of the oxide semiconductor layer or in a region of the oxide semiconductor layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Further, the concentration of nitrogen at a certain depth of the oxide semiconductor layer or in a region of the oxide semiconductor layer is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1\times10^{19}$ atoms/cm$^3$, preferably lower than $5\times10^{18}$ atoms/cm$^3$, further preferably lower than $1\times10^{18}$ atoms/cm$^3$. Further, the concentration of carbon at a certain depth of the oxide semiconductor layer or in a region of the oxide semiconductor layer may be lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

A transistor in which a highly purified oxide semiconductor film is used for a channel formation region as described above has an extremely low off-state current. For example, in the case where the voltage between the source and the drain is set to approximately 0.1 V, 5 V, or 10 V, the off-state current standardized on the channel width of the transistor can be as low as several yoctoamperes per micrometer to several zeptoamperes per micrometer.

Note that as the gate insulating film of the transistor, an insulating film containing silicon is used in many cases; thus, it is preferable that, as in the transistor of one embodiment of the present invention, a region of the oxide semiconductor layer, which serves as a channel, not be in contact with the gate insulating film for the above-described reason. In the case where a channel is formed at the interface between the gate insulating film and the oxide semiconductor layer, scattering of carriers occurs at the interface, whereby the field-effect mobility of the transistor is reduced in some cases. Also from the view of the above, it is preferable that the region of the oxide semiconductor layer, which serves as a channel, be separated from the gate insulating film.

Accordingly, with the oxide semiconductor layer 130 having a stacked-layer structure including the first oxide semiconductor layer 131, the second oxide semiconductor layer 132, and the third oxide semiconductor layer 133, a channel can be formed in the second oxide semiconductor layer 132; thus, the transistor can have a high field-effect mobility and stable electrical characteristics.

In a band diagram, the conduction band minimums of the first oxide semiconductor layer 131, the second oxide semiconductor layer 132, and the third oxide semiconductor layer 133 are continuous. This can be understood also from the fact that the compositions of the first oxide semiconductor layer 131, the second oxide semiconductor layer 132, and the third oxide semiconductor layer 133 are close to one another and oxygen is easily diffused among the first oxide semiconductor layer 131, the second oxide semiconductor layer 132, and the third oxide semiconductor layer 133. Thus, the first oxide semiconductor layer 131, the second oxide semiconductor layer 132, and the third oxide semiconductor layer 133 have a continuous physical property although they have different compositions and form a stack. In the drawings in this specification, interfaces between the oxide semiconductor layers of the stack are indicated by dotted lines.

The oxide semiconductor layer 130 in which layers containing the same main components are stacked is formed to have not only a simple stacked-layer structure of the layers but also a continuous energy band (here, in particular, a well structure having a U shape in which the conduction band minimums are continuous (U-shaped well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga and Zn is 1:3:2, 1:3:3, 1:3:4, 1:3:6, 1:6:4, or 1:9:6 can be used for the first oxide semiconductor layer 131 and the third oxide semiconductor layer 133 and an In—Ga—Zn oxide whose atomic ratio of In to Ga and Zn is 1:1:1, 5:5:6, or 3:1:2 can be used for the second oxide semiconductor layer 132. Alternatively, it is possible to use an In—Ga—Zn oxide whose atomic ratio of In to Ga and Zn is 1:6:4 or 1:9:6 for the first oxide semiconductor layer 131 and an In—Ga—Zn oxide whose atomic ratio of In to Ga and Zn is 1:3:2, 1:3:3, or 1:3:4 for the third oxide semiconductor layer 133, for example.

The second oxide semiconductor layer 132 of the oxide semiconductor layer 130 serves as a well, so that a channel is formed in the second oxide semiconductor layer 132 in a transistor including the oxide semiconductor layer 130. Note that since the conduction band minimums are continuous, the oxide semiconductor layer 130 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 131 and the third oxide semiconductor layer 133. The second oxide semiconductor layer 132 can be distanced away from the trap levels owing to existence of the first oxide semiconductor layer 131 and the third oxide semiconductor layer 133.

However, when the energy differences between the conduction band minimum of the second oxide semiconductor layer 132 and the conduction band minimum of each of the first oxide semiconductor layer 131 and the third oxide semiconductor layer 133 are small, an electron in the second oxide semiconductor layer 132 might reach the trap level by passing over the energy differences. The electron is trapped by the trap level to be negative charge, whereby the threshold voltage of the transistor shifts in the positive direction.

Thus, to reduce fluctuations in the threshold voltage of the transistor, energy differences of at least certain values between the conduction band minimum of the second oxide semiconductor layer 132 and the conduction band minimum of each of the first oxide semiconductor layer 131 and the third oxide semiconductor layer 133 are necessary. Each of the energy differences is preferably greater than or equal to 0.1 eV, further preferably greater than or equal to 0.15 eV.

The first oxide semiconductor layer 131, the second oxide semiconductor layer 132, and the third oxide semiconductor layer 133 preferably include crystal parts. In particular, when crystals with c-axis alignment are used, the transistor can have stable electrical characteristics.

As the source electrode layer 140 and the drain electrode layer 150, a conductive film capable of extracting oxygen from an oxide semiconductor film is preferably used. For example, Al, Cr, Cu, Ta, Ti, Mo, or W can be used. Among the materials, in particular, it is preferable to use Ti which is easily bonded to oxygen or to use W with a high melting point, which allows subsequent process temperatures to be relatively high.

By the conductive film capable of extracting oxygen from the oxide semiconductor film, oxygen in the oxide semiconductor film is released to form oxygen vacancies in the oxide semiconductor film. Hydrogen slightly contained in the film and the oxygen vacancy are bonded to each other, whereby the region is markedly changed to an n-type region. Accordingly, the n-type region can serve as a source or a drain of the transistor.

The gate insulating film 160 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 160 may be a stack of any of the above materials. The gate insulating film 160 may contain lanthanum (La), nitrogen, or zirconium (Zr) as an impurity.

An example of a stacked-layer structure of the gate insulating film 160 will be described. The gate insulating film 160 includes, for example, oxygen, nitrogen, silicon, or hafnium. Specifically, the gate insulating film 160 preferably includes hafnium oxide and silicon oxide or silicon oxynitride.

Hafnium oxide has higher dielectric constant than silicon oxide and silicon oxynitride. Therefore, by using hafnium oxide, a physical thickness can be made larger than an equivalent oxide thickness; thus, even in the case where the equivalent oxide thickness is less than or equal to 10 nm or less than or equal to 5 nm, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In some cases, an interface state due to a defect exists in hafnium oxide having a crystalline structure. The interface state serves as a trap center in some cases. Therefore, when hafnium oxide is provided near a channel region of a transistor, the electrical characteristics of the transistor might deteriorate because of the interface state. In order to reduce the adverse effect of the interface state, in some cases, it is preferable to separate the channel region of the transistor and the hafnium oxide from each other by providing another film therebetween. The film has a buffer function. The film having a buffer function may be included in the gate insulating film 160 or included in the oxide semiconductor layer 130. That is, the film having a buffer function can be formed using silicon oxide, silicon oxynitride, an oxide semiconductor, or the like. Note that the film having a buffer function is formed using, for example, a semiconductor or an insulator having a larger energy gap than a semiconductor to be the channel region. Alternatively, the film having a buffer function is formed using, for example, a semiconductor or an insulator having lower electron affinity than a semiconductor to be the channel region. Further alternatively, the film having a buffer function is formed using, for example, a semiconductor or an insulator having higher ionization energy than a semiconductor to be the channel region.

In some cases, the threshold voltage of a transistor can be controlled by trapping an electric charge in an interface state (trap center) in hafnium oxide having the above-described crystalline structure. In order to make the electric charge exist stably, for example, an insulator having a larger energy gap than hafnium oxide may be provided between the channel region and the hafnium oxide. Alternatively, a semiconductor or an insulator having lower electron affinity than hafnium oxide may be provided. The film having a buffer function may be formed using a semiconductor or an insulator having higher ionization energy than hafnium oxide. With the use of such a semiconductor or an insulator, an electric charge trapped in the interface state is less likely to be released; accordingly, the electric charge can be held for a long period of time.

Examples of such an insulator include silicon oxide and silicon oxynitride. In order to make the interface state in the gate insulating film 160 trap an electric charge, an electron may be transferred from the oxide semiconductor layer 130 toward the gate electrode layer 170. As a specific example, the potential of the gate electrode layer 170 is kept higher than the potential of the source electrode or the drain electrode under high temperature conditions (e.g., a temperature higher than or equal to 125° C. and lower than or equal to 450° C., typically higher than or equal to 150° C. and lower than or equal to 300° C.) for one second or longer, typically for one minute or longer.

The threshold voltage of a transistor in which a predetermined amount of electrons are trapped in interface states in the gate insulating film 160 or the like shifts in the positive direction. The amount of electrons to be trapped (the amount of change in threshold voltage) can be controlled by adjusting a voltage of the gate electrode layer 170 or time in which the voltage is applied. Note that a location in which an electric charge is trapped is not necessarily limited to the inside of the gate insulating film 160 as long as an electric charge can be trapped therein. A stacked film having a similar structure may be used as another insulating layer.

For the gate electrode layer 170, a conductive film formed using Al, Ti, Cr, Co, Ni, Cu, Y, Zr, Mo, Ru, Ag, Ta, W, or the like can be used. The gate electrode layer may be a stack of any of the above materials. Alternatively, a conductive film containing nitrogen may be used for the gate electrode layer.

An aluminum oxide film is preferably included in the insulating layer 180 over the gate insulating film 160 and the gate electrode layer 170. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 130, preventing release of oxygen, which is a main component of the oxide semiconductor layer 130, from the oxide semiconductor layer, and preventing unnecessary release of oxygen from the insulating layer 120. Further, oxygen contained in the aluminum oxide film can be diffused in the oxide semiconductor layer.

Further, the insulating layer 185 is preferably formed over the insulating layer 180. Each of the insulating layers can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Each of the insulating layers may be a stack of any of the above materials.

Here, like the insulating layer 120, the insulating layer 185 preferably contains oxygen more than that in the stoichiometric composition. Oxygen released from the insulating layer 185 can be diffused into the channel formation region in the oxide semiconductor layer 130 through the gate insulating film 160, so that oxygen vacancies formed in the channel formation region can be filled with the oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. A decrease in channel width causes a reduction in on-state current.

In the transistor of one embodiment of the present invention shown in FIGS. 7A to 7C, for example, as described above, the third oxide semiconductor layer 133 is formed so as to cover the second oxide semiconductor layer 132 where a channel is formed and the channel formation layer and the gate insulating film are not in contact with each other. Accordingly, scattering of carriers at the interface between the channel formation layer and the gate insulating film can be reduced and the on-state current of the transistor can be increased.

In the transistor of one embodiment of the present invention, as described above, the gate electrode layer 170 is formed to electrically surround the oxide semiconductor layer 130 in the channel width direction; accordingly, a gate electric field is applied to the oxide semiconductor layer 130 in the side surface direction in addition to the perpendicular direction. In other words, a gate electric field is applied to the oxide semiconductor layer 130 entirely, so that current flows in the whole of the second oxide semiconductor layer 132 serving as a channel, leading to a further increase in on-state current.

In the transistor of one embodiment of the present invention, the second oxide semiconductor layer 132 is formed over the first oxide semiconductor layer 131, so that an interface state is less likely to be formed. In addition, impurities do not enter the second oxide semiconductor layer 132 from above and below because the second oxide semiconductor layer 132 is positioned at the middle of the three-layer structure. Therefore, the transistor can achieve not only the increase in the on-state current of the transistor but also stabilization of the threshold voltage and a reduction in the S value (subthreshold value). Thus, Icut (current when gate voltage VG is 0 V) can be reduced and power consumption can be reduced. Further, since the threshold voltage of the transistor becomes stable, long-term reliability of the semiconductor device can be improved.

This embodiment can be combined as appropriate with any of the other embodiments and an example in this specification.

Embodiment 2

In this embodiment, methods for manufacturing the transistors 101, 102, and 103 described in Embodiment 1 are described.

First, the method for manufacturing the transistor 102 is described with reference to FIGS. 11A to 11C and FIGS. 12A to 12C. In addition, the method for manufacturing the transistor 101, which differs from the transistor 102 only in the structure of the oxide semiconductor layer 130, is described. In each of FIGS. 11A to 11C and FIGS. 12A to 12C, a cross section of the transistor in the channel length direction is shown on the left side, and a cross section of the transistor in the channel width direction is shown on the right side. The cross-sectional views in the channel width direction are enlarged views; therefore, components on the left side and those on the right side differ in apparent thickness.

For the substrate 110, a glass substrate, a ceramic substrate, a quartz substrate, a sapphire substrate, or the like can be used. Alternatively, a single crystal semiconductor substrate or a polycrystalline semiconductor substrate of silicon, silicon carbide, or the like, a compound semiconductor substrate of silicon germanium or the like, a silicon-on-insulator (SOI) substrate, or the like may be used. Still alternatively, any of these substrates provided with a semiconductor element may be used.

The insulating layer 120 can be formed by a plasma CVD method, a sputtering method, or the like using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a film in which any of the above materials are mixed. Alternatively, a stack including any of the above materials may be used, and at least an upper layer of the insulating layer 120 which is in contact with the oxide semiconductor layer 130 is preferably formed using a material containing excess oxygen that might serve as a supply source of oxygen to the oxide semiconductor layer 130.

Oxygen may be added to the insulating layer 120 by an ion implantation method, an ion doping method, a plasma immersion ion implantation method, or the like. Adding oxygen enables the insulating layer 120 to supply oxygen much easily to the oxide semiconductor layer 130.

In the case where a surface of the substrate 110 is made of an insulator and there is no influence of impurity diffusion to the oxide semiconductor layer 130 to be formed later, the insulating layer 120 is not necessarily provided.

Figure 11A:
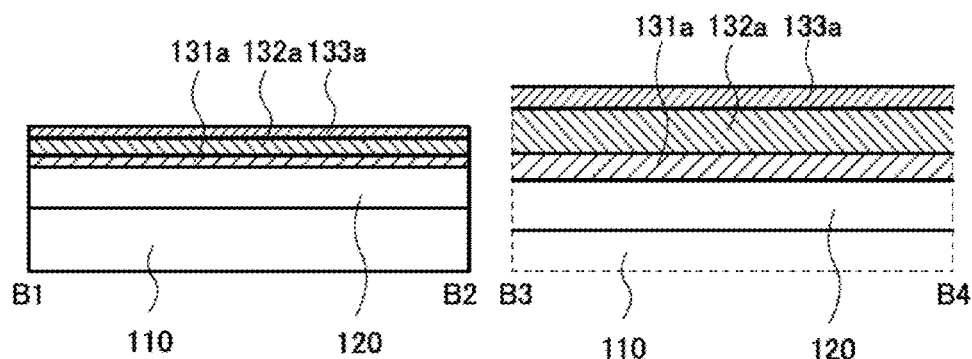
FIGS. 11A to 11C illustrate a method for manufacturing a transistor.
Figure 11B:
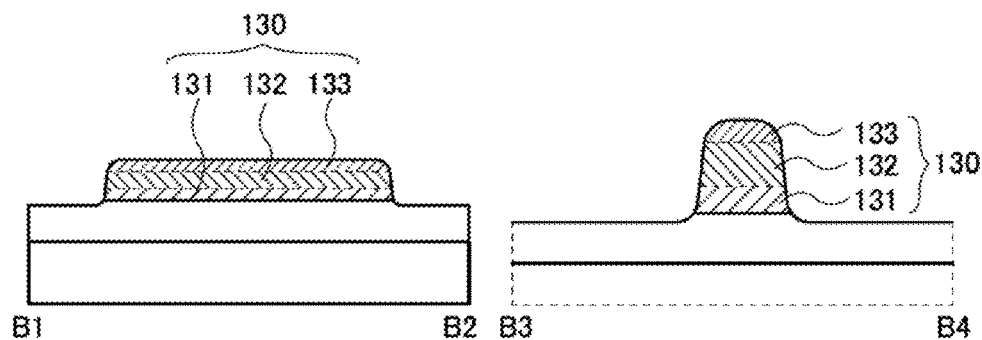
Figure 11C:
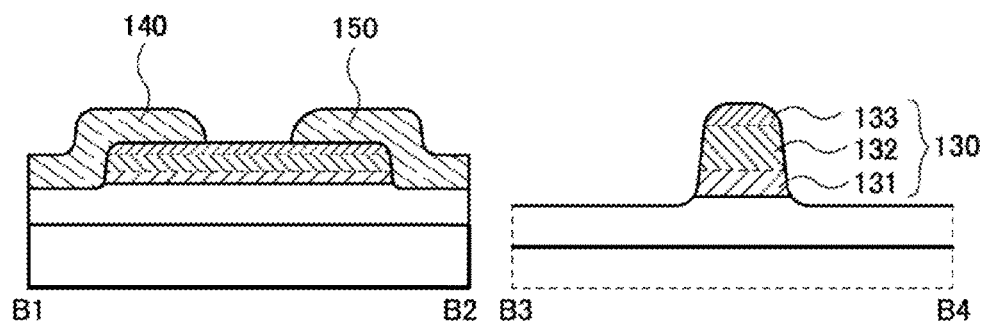

Next, a first oxide semiconductor film 131a to be the first oxide semiconductor layer 131, a second oxide semiconductor film 132a to be the second oxide semiconductor layer 132, and a third oxide semiconductor film 133a to be the third oxide semiconductor layer 133 are formed over the insulating layer 120 by a sputtering method, a CVD method, an MBE method, or the like (see FIG. 11A).

Note that in the case where the transistor 101 in FIGS. 1A to 1C is formed, a single film of the second oxide semiconductor film 132a is provided.

In the case where the oxide semiconductor layer 130 has a stacked-layer structure, oxide semiconductor films are preferably formed successively without exposure to the air with the use of a multi-chamber deposition apparatus (e.g., a sputtering apparatus) including a load lock chamber. It is preferable that each chamber of the sputtering apparatus be able to be evacuated to a high vacuum (approximately $5 \times 10^{-7}$ Pa to $1 \times 10^{-4}$ Pa) by an adsorption vacuum evacuation pump such as a cryopump and that the chamber be able to heat a substrate over which a film is to be deposited to 100° C. or higher, preferably 500° C. or higher, so that water and the like acting as impurities of an oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation of the chamber but also high purity of a sputtering gas is necessary to obtain a highly purified intrinsic oxide semiconductor. As an oxygen gas or an argon gas used for a sputtering gas, a gas which is highly purified to have a dew point of −40° C. or lower, preferably −80° C. or lower, further preferably −100° C. or lower is used, whereby entry of moisture or the like into the oxide semiconductor film can be prevented as much as possible.

For the first oxide semiconductor film 131a, the second oxide semiconductor film 132a, and the third oxide semiconductor film 133a, any of the materials described in Embodiment 1 can be used. For example, an In—Ga—Zn oxide whose atomic ratio of In to Ga and Zn is 1:3:6, 1:3:4, 1:3:3, or 1:3:2 can be used for the first oxide semiconductor film 131a, an In—Ga—Zn oxide whose atomic ratio of In to Ga and Zn is 1:1:1, 3:1:2, or 5:5:6 can be used for the second oxide semiconductor film 132a, and an In—Ga—Zn oxide whose atomic ratio of In to Ga and Zn is 1:3:6, 1:3:4, 1:3:3, or 1:3:2 can be used for the third oxide semiconductor film 133a.

An oxide semiconductor that can be used for each of the first oxide semiconductor film 131a, the second oxide semiconductor film 132a, and the third oxide semiconductor film 133a preferably contains at least indium (In) or zinc (Zn). Both In and Zn are preferably contained. In order to reduce fluctuations in electrical characteristics of the transistor including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, gallium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_n$ (n>0, n is an integer) may be used.

Note that as described in Embodiment 1 in detail, materials are selected so that the first oxide semiconductor film 131a and the third oxide semiconductor film 133a each have an electron affinity lower than that of the second oxide semiconductor film 132a.

Note that the oxide semiconductor films are preferably formed by a sputtering method. As a sputtering method, an RF sputtering method, a DC sputtering method, an AC sputtering method, or the like can be used.

In the case of using an In—Ga—Zn oxide for each of the first oxide semiconductor film 131a, the second oxide semiconductor film 132a, and the third oxide semiconductor film 133a, a material whose atomic ratio of In to Ga and Zn is any of 1:1:1, 2:2:1, 3:1:2, 5:5:6, 1:3:2, 1:3:3, 1:3:4, 1:3:6, 1:4:3, 1:5:4, 1:6:6, 2:1:3, 1:6:4, 1:9:6, 1:1:4, and 1:1:2 can be used.

The indium content in the second oxide semiconductor film 132a is preferably higher than those in the first and third oxide semiconductor films 131a and 133a. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with the use of an oxide having a high indium content for the second oxide semiconductor layer 132, a transistor having high mobility can be achieved.

First heat treatment may be performed after the third oxide semiconductor film 133a is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate released oxygen. The first heat treatment can increase the crystallinity of the first to third oxide semiconductor films 131a to 133a and remove impurities such as water and hydrogen from the insulating layer 120 and the first to third oxide semiconductor films 131a to 133a. Note that the first heat treatment may be performed after etching for formation of the first to third oxide semiconductor layers 131 to 133, which is described later.

Next, a first resist mask is formed over the third oxide semiconductor film 133a. It is preferable that the resist mask be formed by a photolithography process using electron beam exposure, liquid immersion exposure, or EUV exposure, for example. At this time, using a negative photoresist material for forming the first resist mask can shorten the time needed for the light exposure step. The third oxide semiconductor film 133a, the second oxide semiconductor film 132a, and the first oxide semiconductor film 131a are selectively etched with the use of the first resist mask, whereby the oxide semiconductor layer 130 formed using a stack including the third oxide semiconductor layer 133, the second oxide semiconductor layer 132, and the first oxide semiconductor layer 131 is formed (see FIG. 11B). It is also possible to use a hard mask to form the oxide semiconductor layer 130. The hard mask is obtained by forming a metal film, an insulating film, or the like over the third oxide semiconductor film 133a and selectively etching the film with the use of a second resist mask. Note that in the case where the transistor 101 in FIGS. 1A to 1C is formed, the formed oxide semiconductor film is etched by the above method, whereby the oxide semiconductor layer 130 is formed.

At this time, etching conditions and the like are adjusted as appropriate so that corner portions and the like of the oxide semiconductor layer 130 have the shapes described in Embodiment 1. As shown in the drawings, the insulating layer 120 may be partly etched.

Next, a first conductive film is formed over the oxide semiconductor layer 130. For the first conductive film, a single layer, a stack, or an alloy of any of Al, Cr, Cu, Ta, Ti, Mo, and W can be used. For example, a 100-nm-thick tungsten film is formed by a sputtering method, a CVD method, or the like.

Next, a second resist mask is formed over the first conductive film. Then, the first conductive film is selectively etched using the second resist mask as a mask, so that the source electrode layer 140 and the drain electrode layer 150 are formed (see FIG. 11C).

Figure 12A:
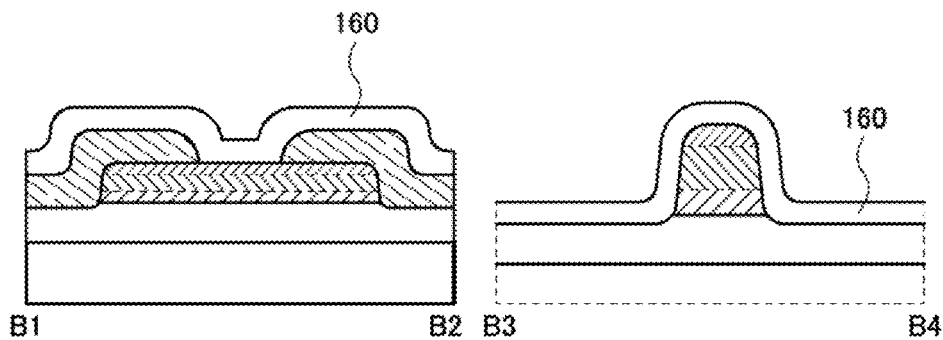
FIGS. 12A to 12C illustrate a method for manufacturing a transistor.

Next, the gate insulating film 160 is formed over the oxide semiconductor layer 130, the source electrode layer 140, and the drain electrode layer 150 (see FIG. 12A). The gate insulating film 160 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 160 may be a stack including any of the above materials. The gate insulating film 160 can be formed by a sputtering method, a CVD method, an MBE method, or the like.

Then, a second conductive film to be the gate electrode layer 170 is formed over the gate insulating film 160. For the second conductive film, a single layer, a stack, or an alloy of any of Al, Ti, Cr, Co, Ni, Cu, Y, Zr, Mo, Ru, Ag, Ta, and W can be used. The second conductive film can be formed by a sputtering method, a CVD method, or the like. A stack including a conductive film containing any of the above materials and a conductive film containing nitrogen, or a conductive film containing nitrogen may be used for the second conductive film.

Figure 12B:
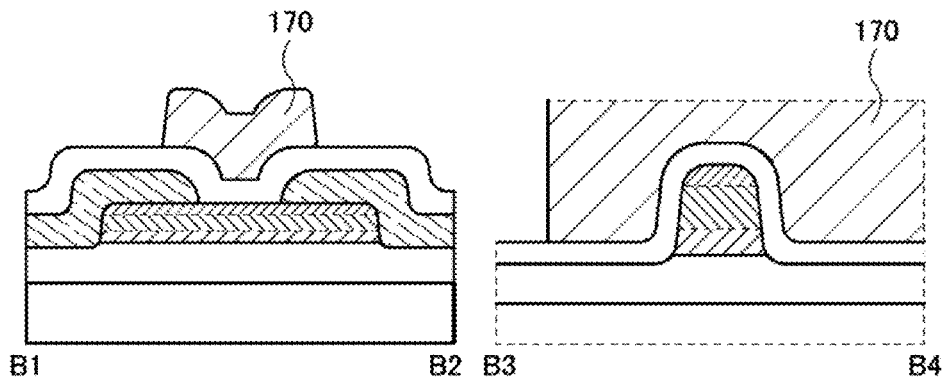

After that, a third resist mask is formed over the second conductive film, and the second conductive film is selectively etched using the third resist mask to form the gate electrode layer 170 (see FIG. 12B).

Figure 12C:
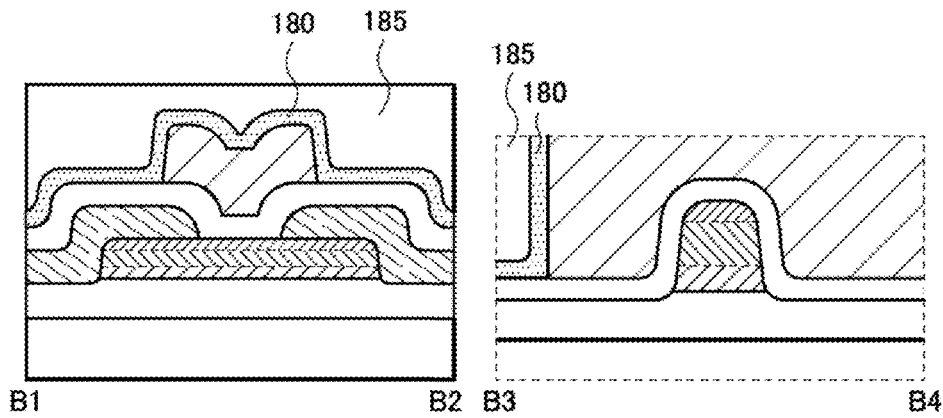

Then, the insulating layer 180 and the insulating layer 185 are formed over the gate insulating film 160 and the gate electrode layer 170 (see FIG. 12C). The insulating layer 180 and the insulating layer 185 can each be formed using a material and a method which are similar to those of the insulating layer 120. Note that it is particularly preferable to use aluminum oxide for the insulating layer 180.

Oxygen may be added to the insulating layer 180 and/or the insulating layer 185 by an ion implantation method, an ion doping method, a plasma immersion ion implantation method, or the like. Adding oxygen enables the insulating layer 180 and/or the insulating layer 185 to supply oxygen much easily to the oxide semiconductor layer 130.

After that, second heat treatment may be performed. The second heat treatment can be performed in a condition similar to that of the first heat treatment. By the second heat treatment, excess oxygen is easily released from the insulating layer 120, the insulating layer 180, and the insulating layer 185, so that oxygen vacancies in the oxide semiconductor layer 130 can be reduced.

Through the above steps, the transistor 102 shown in FIGS. 6A to 6C can be manufactured. In addition, as described above, when a single layer is used as the oxide semiconductor layer 130, the transistor 101 shown in FIGS. 1A to 1C can be manufactured.

Next, the method for manufacturing the transistor 103 shown in FIGS. 7A to 7C is described. Note that description of steps similar to those for manufacturing the transistor 101 and the transistor 102 is omitted.

Figure 13A:
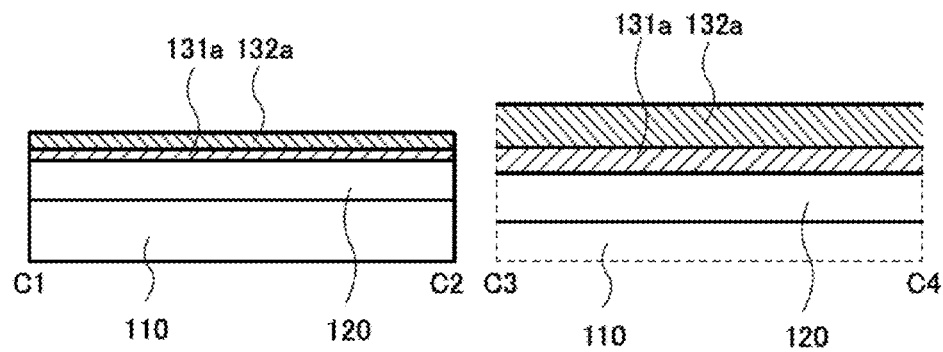
FIGS. 13A to 13C illustrate a method for manufacturing a transistor.

The insulating layer 120 is formed over the substrate 110, and the first oxide semiconductor film 131a to be the first oxide semiconductor layer 131 and the second oxide semiconductor film 132a to be the second oxide semiconductor layer 132 are formed over the insulating layer 120 by a sputtering method, a CVD method, an MBE method, or the like (see FIG. 13A).

Figure 13B:
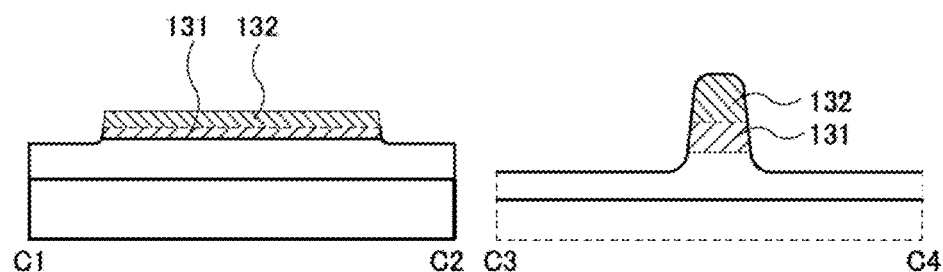

Next, a first resist mask is formed over the second oxide semiconductor film 132a. The second oxide semiconductor film 132a and the first oxide semiconductor film 131a are selectively etched with the use of the first resist mask, whereby a stack including the second oxide semiconductor layer 132 and the first oxide semiconductor layer 131 is formed (see FIG. 13B).

Next, a first conductive film is formed over the stack including the second oxide semiconductor layer 132 and the first oxide semiconductor layer 131. For this step, the description on the first conductive film used for forming the transistor 101 or the transistor 102 can be referred to.

Figure 13C:
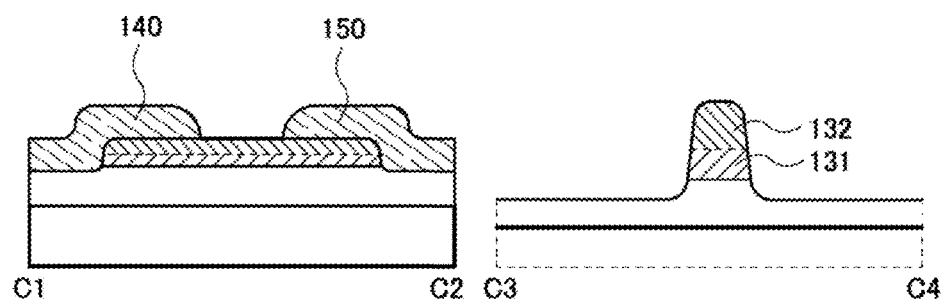

Next, a second resist mask is formed over the first conductive film. Then, the first conductive film is selectively etched using the second resist mask as a mask, so that the source electrode layer 140 and the drain electrode layer 150 are formed (see FIG. 13C).

Next, the third oxide semiconductor film 133a to be the third oxide semiconductor layer 133 is formed over the stack including the second oxide semiconductor layer 132 and the first oxide semiconductor layer 131, the source electrode layer 140, and the drain electrode layer 150 by a sputtering method, a CVD method, an MBE method, or the like.

Next, the gate insulating film 160 is formed over the third oxide semiconductor film 133a. For this step, the description on the gate insulating film 160 of the transistor 101 or the transistor 102 can be referred to.

Then, a second conductive film 170a to be the gate electrode layer 170 is formed over the gate insulating film 160. For this step, the description on the second conductive film used for forming the transistor 101 or the transistor 102 can be referred to.

Figure 14A:
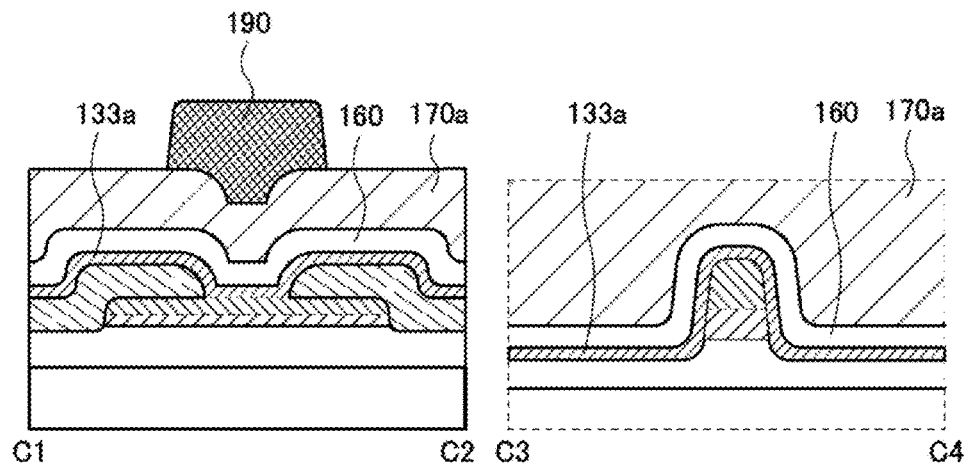
FIGS. 14A to 14C illustrate a method for manufacturing a transistor.

Next, a third resist mask 190 is formed over the second conductive film 170a (see FIG. 14A). Then, the second conductive film 170a is selectively etched using the third resist mask 190 to form the gate electrode layer 170.

Then, the gate insulating film 160 is selectively etched using the gate electrode layer 170 as a mask.

Figure 14B:
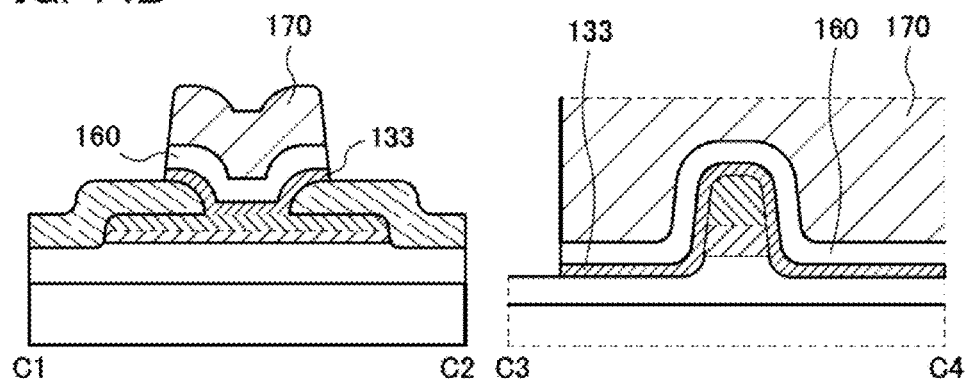

After that, the third oxide semiconductor film 133a is etched using the gate electrode layer 170 or the gate insulating film 160 as a mask to form the third oxide semiconductor layer 133 (see FIG. 14B).

The second conductive film 170a, the gate insulating film 160, and the third oxide semiconductor film 133a may be etched individually or successively. Either dry etching or wet etching may be used as the etching method, and an appropriate etching method may be selected individually.

Figure 14C:
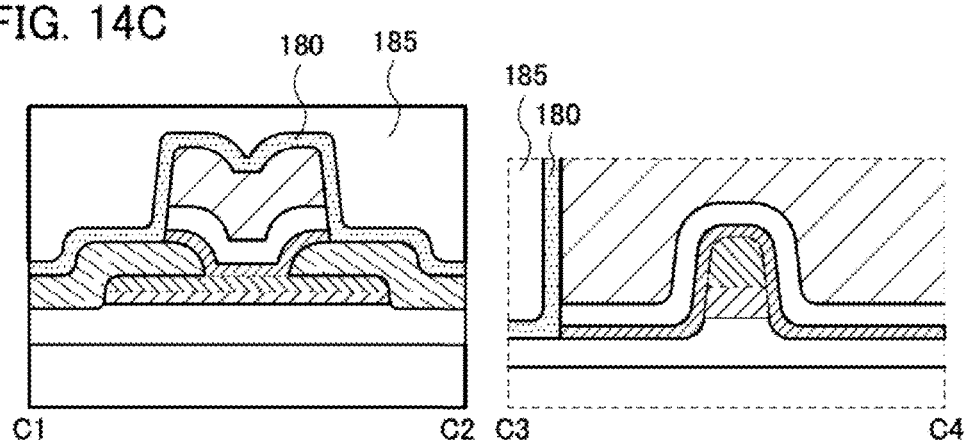

Next, the insulating layer 180 and the insulating layer 185 are formed over the source electrode layer 140, the drain electrode layer 150, and the gate electrode layer 170 (see FIG. 14C). For this step, the description on the insulating layer 180 and the insulating layer 185 of the transistor 101 or the transistor 102 can be referred to.

Through the above steps, the transistor 103 shown in FIGS. 7A to 7C can be manufactured.

Although the variety of films such as the metal films, the semiconductor films, and the inorganic insulating films which are described in this embodiment typically can be formed by a sputtering method or a plasma CVD method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and diethylzinc can be used. Note that the chemical formula of trimethylindium is $In(CH_3)_3$. The chemical formula of trimethylgallium is $Ga(CH_3)_3$. The chemical formula of diethylzinc is $Zn(C_2H_5)_2$. Without limitation to the above combination, triethylgallium (chemical formula: $Ga(C_2H_5)_3$) can be used instead of trimethylgallium and dimethylzinc (chemical formula: $Zn(CH_3)_2$) can be used instead of diethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be combined as appropriate with any of the other embodiments and an example in this specification.

Embodiment 3

Structure of Oxide Semiconductor

A structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 15A:
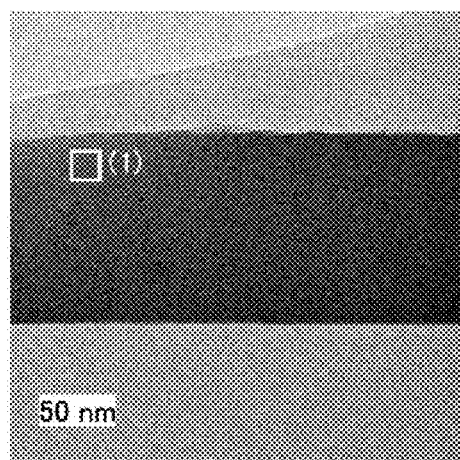
FIGS. 15A to 15D are Cs-corrected high-resolution TEM images of a cross section of a CAAC-OS and a cross-sectional schematic view of the CAAC-OS.

A CAAC-OS observed with TEM is described below. FIG. 15A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 15B:
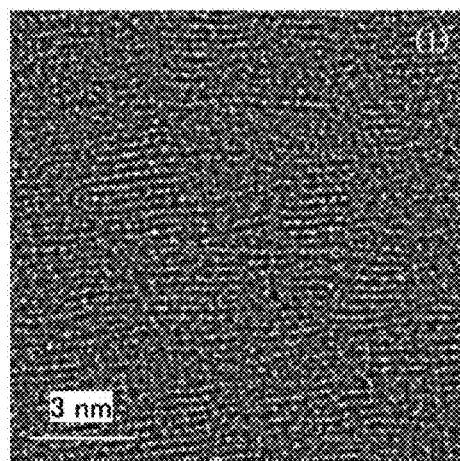

FIG. 15B is an enlarged Cs-corrected high-resolution TEM image of a region (1) in FIG. 15A. FIG. 15B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 15C:
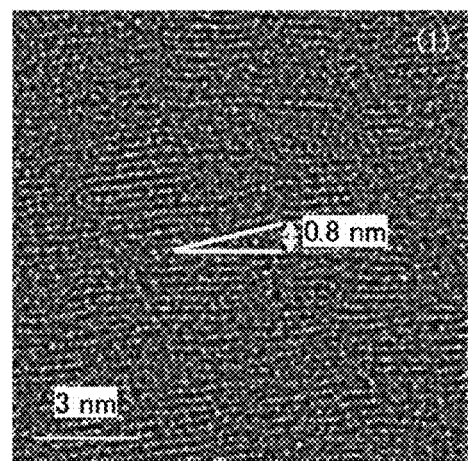

As shown in FIG. 15B, the CAAC-OS has a characteristic atomic arrangement. The characteristic atomic arrangement is denoted by an auxiliary line in FIG. 15C. FIGS. 15B and 15C prove that the size of a pellet is approximately 1 nm to 3 nm, and the size of a space caused by tilt of the pellets is approximately 0.8 nm. Therefore, the pellet can also be referred to as a nanocrystal (nc).

Figure 15D:
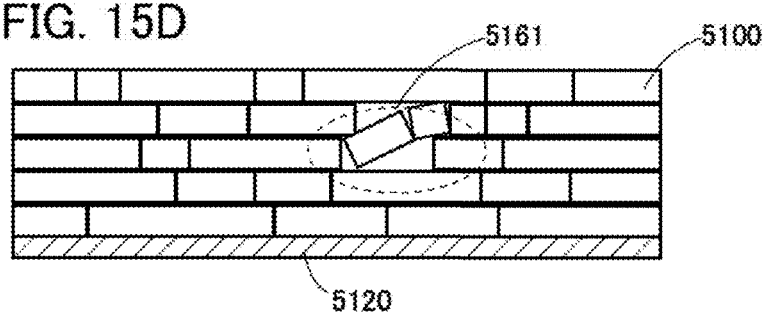

Here, according to the Cs-corrected high-resolution TEM images, the schematic arrangement of pellets 5100 of a CAAC-OS over a substrate 5120 is illustrated by such a structure in which bricks or blocks are stacked (see FIG. 15D). The part in which the pellets are tilted as observed in FIG. 15C corresponds to a region 5161 shown in FIG. 15D.

FIG. 16A shows a Cs-corrected high-resolution TEM image of a plane of the CAAC-OS observed from a direction substantially perpendicular to the sample surface. FIGS. 16B, 16C, and 16D are enlarged Cs-corrected high-resolution TEM images of regions (1), (2), and (3) in FIG. 16A, respectively. FIGS. 16B, 16C, and 16D indicate that metal atoms are arranged in a triangular, quadrangular, or hexagonal configuration in a pellet. However, there is no regularity of arrangement of metal atoms between different pellets.

Figure 17A:
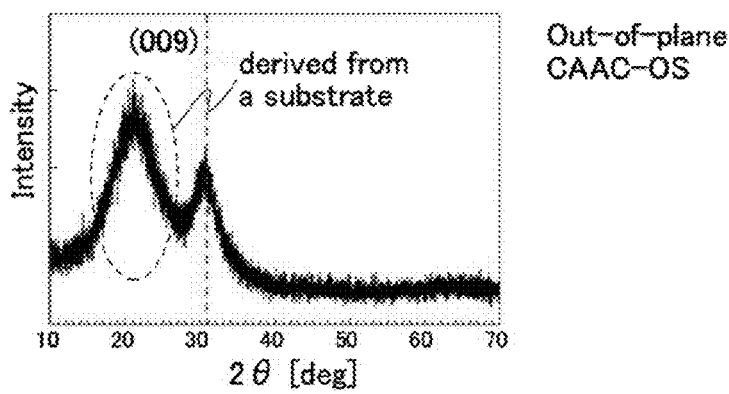
FIGS. 17A to 17C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 17A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 17B:
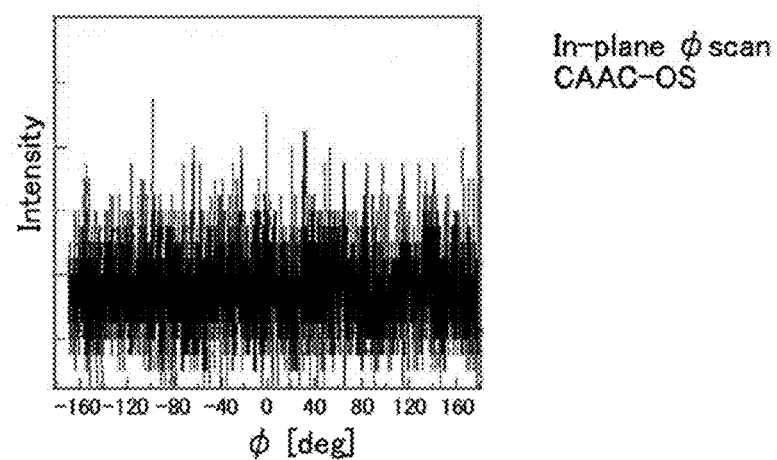
Figure 17C:
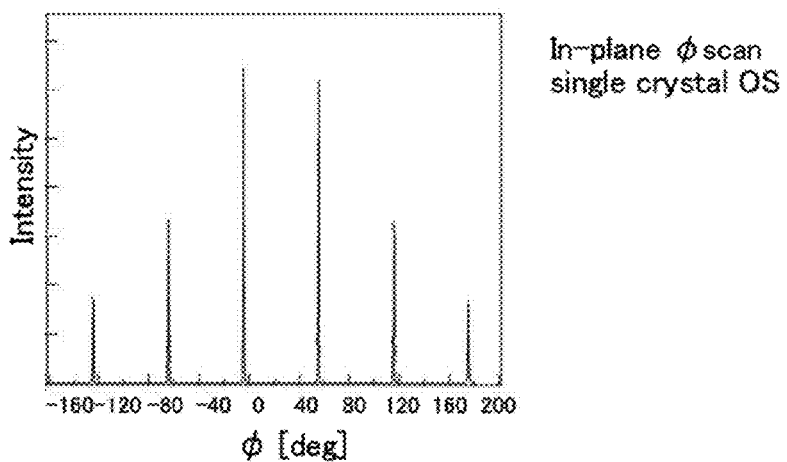

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 17B, a peak is not clearly observed. In contrast, in the case of a single crystal oxide semiconductor of $InGaZnO_4$, when φ scan is performed with 2θ fixed at around 56°, as shown in FIG. 17C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 30A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 30B shows a diffraction pattern obtained in such a manner that an electron beam with a probe diameter of 300 nm is incident on the same sample in a direction perpendicular to the sample surface. As shown in FIG. 30B, a ring-like diffraction pattern is observed. Thus, the electron diffraction also indicates that the a-axes and b-axes of the pellets included in the CAAC-OS do not have regular alignment. The first ring in FIG. 30B is considered to be derived from the (010) plane, the (100) plane, and the like of the $InGaZnO_4$ crystal. The second ring in FIG. 30B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carries generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 31:
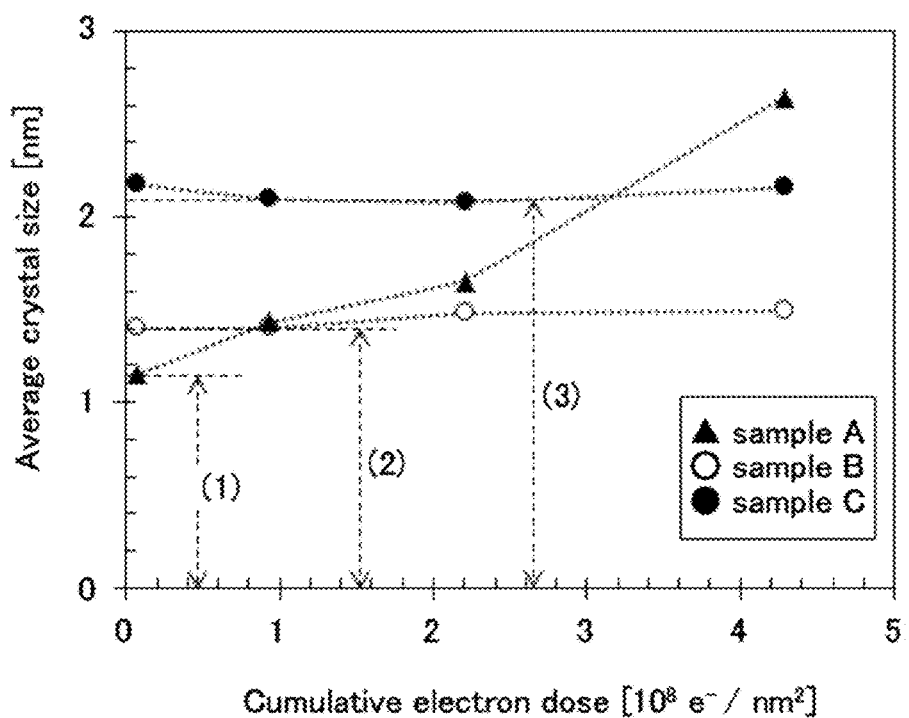
FIG. 31 shows a change in crystal part of an In—Ga—Zn oxide induced by electron irradiation.

FIG. 31 shows change in the average size of crystal parts (at 22 points to 45 points) in each sample. Note that the crystal part size corresponds to the length of a lattice fringe. FIG. 31 indicates that the crystal part size in the a-like OS increases with an increase in the cumulative electron dose. Specifically, as shown by (1) in FIG. 31, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. Specifically, as shown by (2) and (3) in FIG. 31, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 32A:
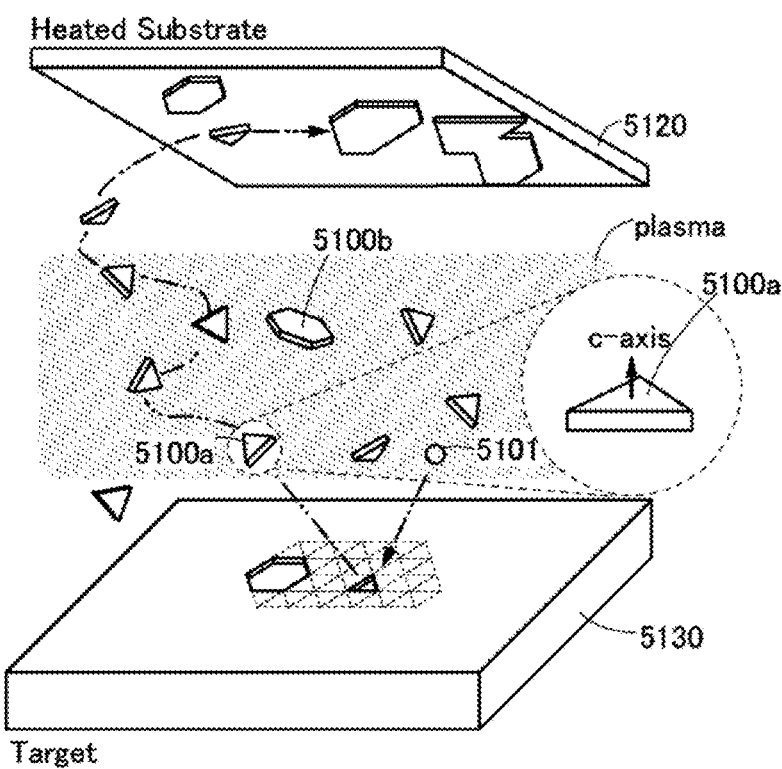
FIGS. 32A and 32B are schematic views showing deposition models of a CAAC-OS and an nc-OS.

FIG. 32A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 33A:
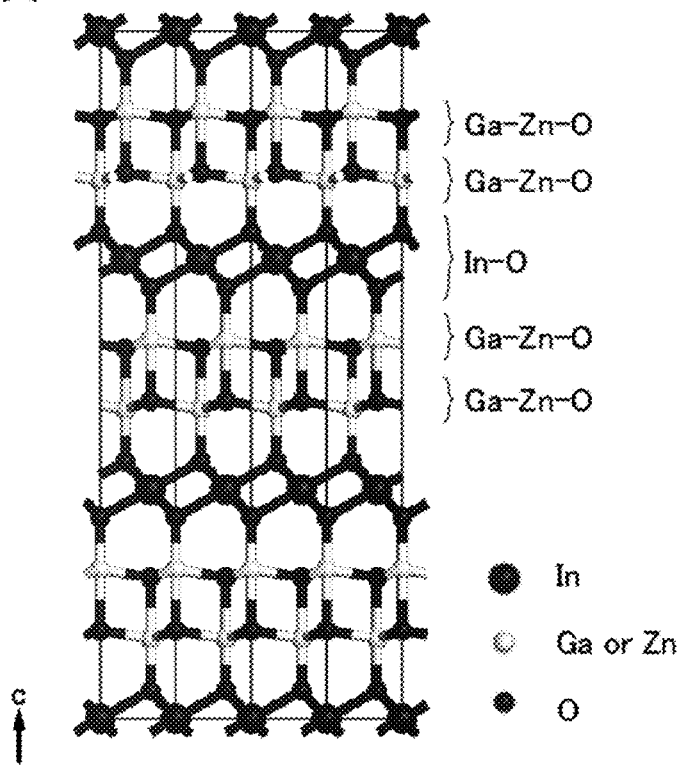
FIGS. 33A to 33C show an InGaZnO$_4$ crystal and a pellet.

Here, the target 5130 has a polycrystalline structure which includes a plurality of crystal grains and in which a cleavage plane exists in at least one crystal grain. FIG. 33A shows a structure of an $InGaZnO_4$ crystal included in the target 5130 as an example. Note that FIG. 33A shows a structure of the case where the $InGaZnO_4$ crystal is observed from a direction parallel to the b-axis. FIG. 33A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 33B:
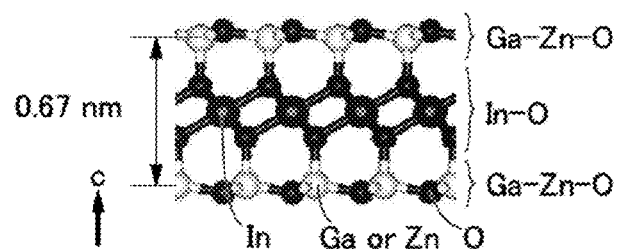
Figure 33C:
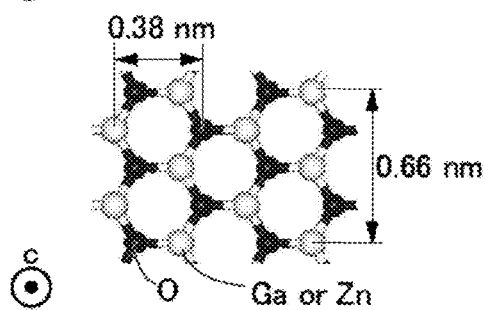

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 31. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 33B is separated. Note that FIG. 33C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 31 corresponds to the amount of growth in plasma. Here, in the case where the temperature of the substrate 5120 is at around room temperature, the pellet 5100 on the substrate 5120 hardly grows; thus, an nc-OS is formed (see FIG. 32B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 32B:
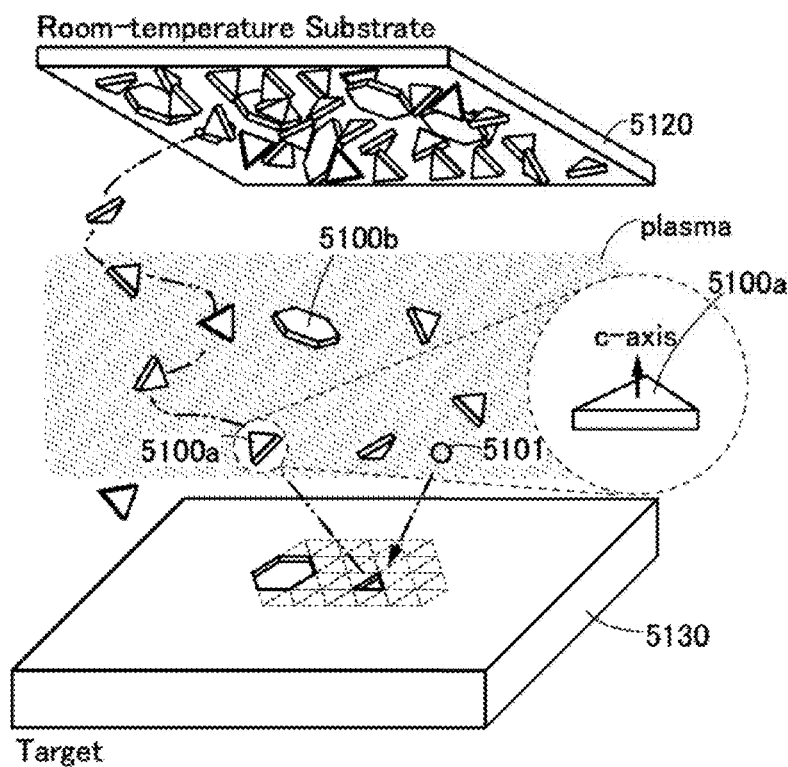

As shown in FIGS. 32A and 32B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5200, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 32A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 34A to 34D are cross-sectional schematic views.

Figure 34A:
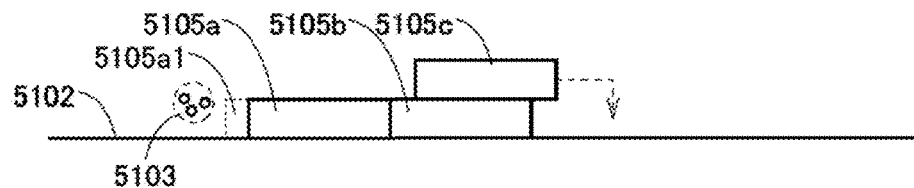
FIGS. 34A to 34D are schematic views showing a deposition model of a CAAC-OS.

As illustrated in FIG. 34A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 34B:
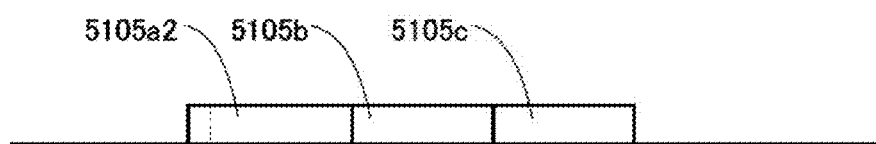

Then, as illustrated in FIG. 34B, the region 5105a1 grows to part of the pellet 5105a to form a pellet 5105a2. In addition, a side surface of the pellet 5105c is in contact with another side surface of the pellet 5105b.

Figure 34C:
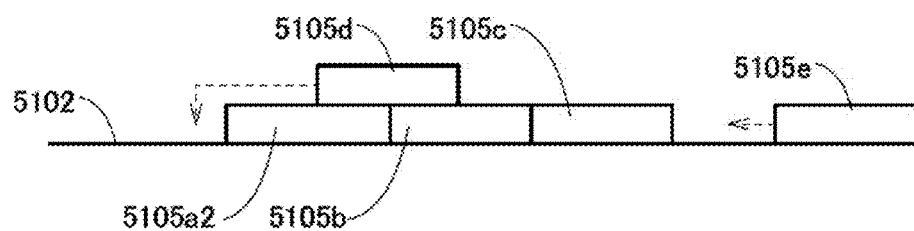

Next, as illustrated in FIG. 34C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 34D:
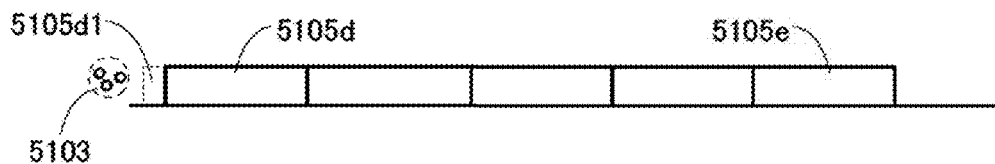

Then, as illustrated in FIG. 34D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 31 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thickness of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

Embodiment 4

In this embodiment, an example of a circuit including the transistor of one embodiment of the present invention is described with reference to drawings.
[Cross-Sectional Structure]
FIG. 18A is a cross-sectional view of a semiconductor device of one embodiment of the present invention. The semiconductor device illustrated in FIG. 18A includes a transistor 2200 containing a first semiconductor material in a lower portion and a transistor 2100 containing a second semiconductor material in an upper portion. In FIG. 18A, an example is described in which the transistor described in the above embodiment as an example is used as the transistor 2100 containing the second semiconductor material. A cross-sectional view of the transistors in a channel length direction is on the left side of a dashed-dotted line, and a cross-sectional view of the transistors in a channel width direction is on the right side of the dashed-dotted line.

Here, the first semiconductor material and the second semiconductor material are preferably materials having different band gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 18A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor film of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor film of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (corresponding to the insulating layer 180 in the transistors 101 to 103) having a function of preventing diffusion of hydrogen is preferably formed over the transistor 2100 to cover the transistor 2100 including an oxide semiconductor film. For the blocking film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor film included in the transistor 2100 can be prevented and entry of water and hydrogen into the oxide semiconductor film can be prevented.

Note that the transistor 2200 can be a transistor of various types without being limited to a planar type transistor. For example, the transistor 2200 can be a fin-type transistor, a tri-gate transistor, or the like. An example of a cross-sectional view in this case is shown in FIG. 18D. An insulating film 2212 is provided over a semiconductor substrate 2211. The semiconductor substrate 2211 includes a projecting portion with a thin tip (also referred to a fin). Note that an insulating film may be provided over the projecting portion. The insulating film functions as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

A circuit diagram in FIG. 18B shows a configuration of a so-called CMOS circuit in which the p-channel transistor 2200 and the n-channel transistor 2100 are connected to each other in series and in which gates of them are connected to each other.

[Analog Switch]

A circuit diagram in FIG. 18C shows a configuration in which sources of the transistors 2100 and 2200 are connected to each other and drains of the transistors 2100 and 2200 are connected to each other. With such a configuration, the transistors can function as a so-called analog switch.

[Memory Device Example]

Figure 19A:
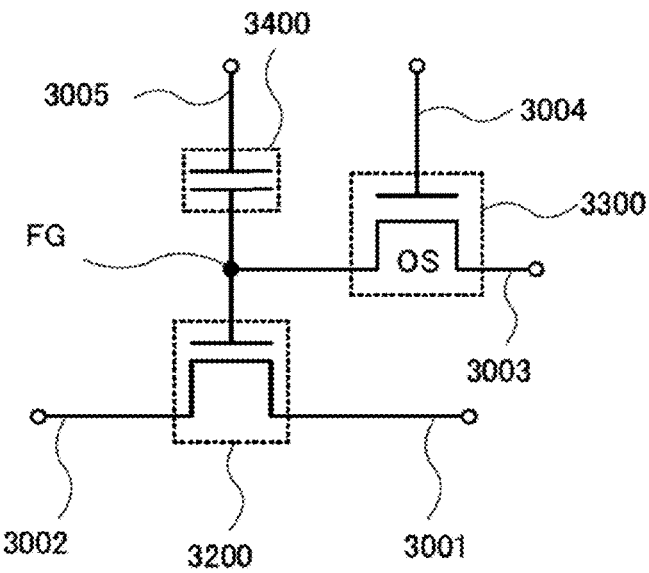
FIGS. 19A to 19C are a cross-sectional view and circuit diagrams of memory devices.
Figure 19B:
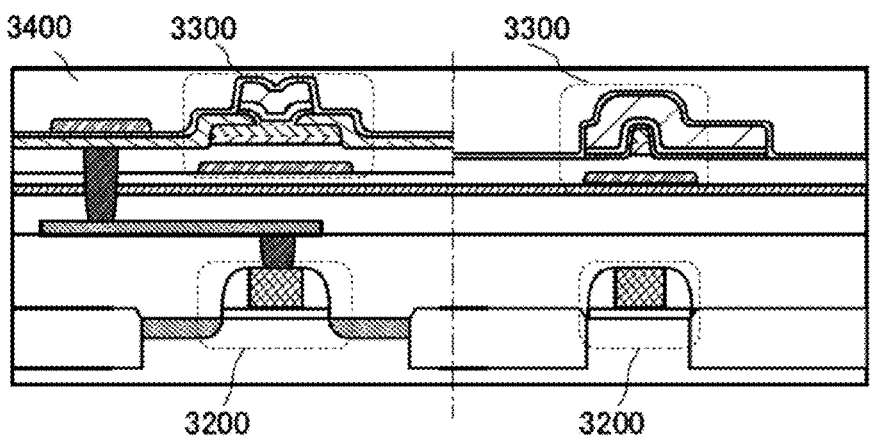
Figure 19C:
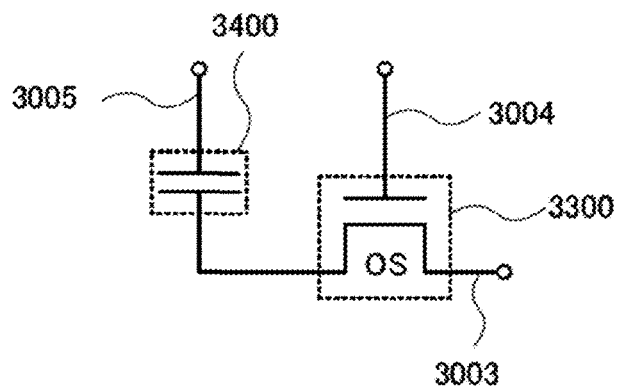

An example of a semiconductor device (memory device) which includes the transistor of one embodiment of the present invention, which can retain stored data even when not powered, and which has an unlimited number of write cycles is shown in FIGS. 19A to 19C.

The semiconductor device illustrated in FIG. 19A includes a transistor 3200 using a first semiconductor material, a transistor 3300 using a second semiconductor material, and a capacitor 3400. Note that any of the above-described transistors can be used as the transistor 3300.

FIG. 19B is a cross-sectional view of the semiconductor device illustrated in FIG. 19A. The semiconductor device in the cross-sectional view has a structure in which the transistor 3300 is provided with a back gate; however, a structure without a back gate may be employed.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 19A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode and the drain electrode of the transistor 3300 and one electrode of the capacitor 3400. A fifth wiring 3005 is electrically connected to the other electrode of the capacitor 3400.

The semiconductor device in FIG. 19A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage Vth L at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed to be used, it is necessary that only data of a desired memory cell be able to be read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 19C is different from the semiconductor device illustrated in FIG. 19A in that the transistor 3200 is not provided. Also in this case, writing and retaining operation of data can be performed in a manner similar to the semiconductor device illustrated in FIG. 19A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where there are several possible portions to which a terminal can be connected, it is not necessary to specify all the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or a text described in one embodiment can be taken out to constitute one embodiment of the invention. Thus, in the case where a diagram or a text related to a certain part is described, a content taken out from the diagram or the text of the certain part is also disclosed as one embodiment of the invention and can constitute one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

This embodiment can be combined as appropriate with any of the other embodiments and an example in this specification.

Embodiment 5

In this embodiment, an RF tag that includes the transistor described in the above embodiments or the memory device described in the above embodiment is described with reference to FIG. 20.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 20. FIG. 20 is a block diagram illustrating a configuration example of an RF tag.

Figure 20:
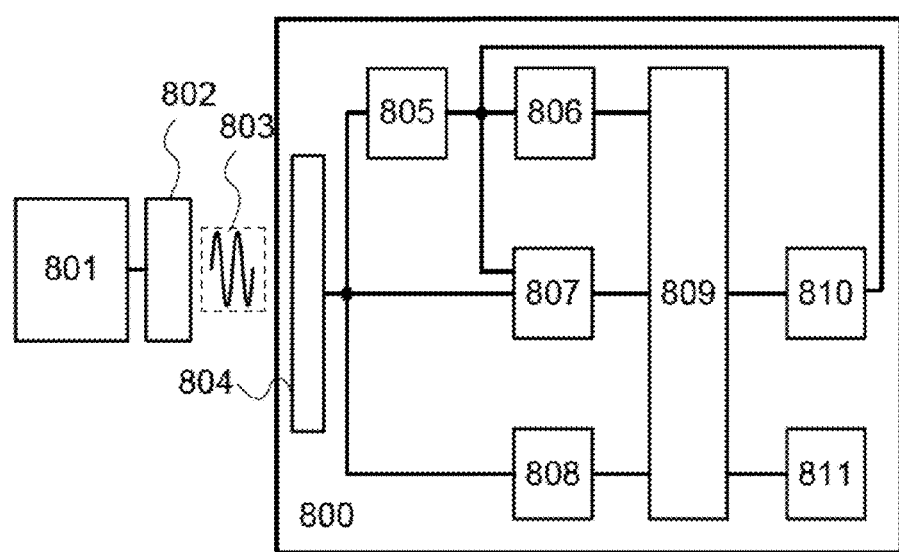
FIG. 20 illustrates a configuration example of an RF tag.

As shown in FIG. 20, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

This embodiment can be combined as appropriate with any of the other embodiments and an example in this specification.

Embodiment 6

In this embodiment, a CPU that includes the memory device described in the above embodiment is described.

Figure 21:
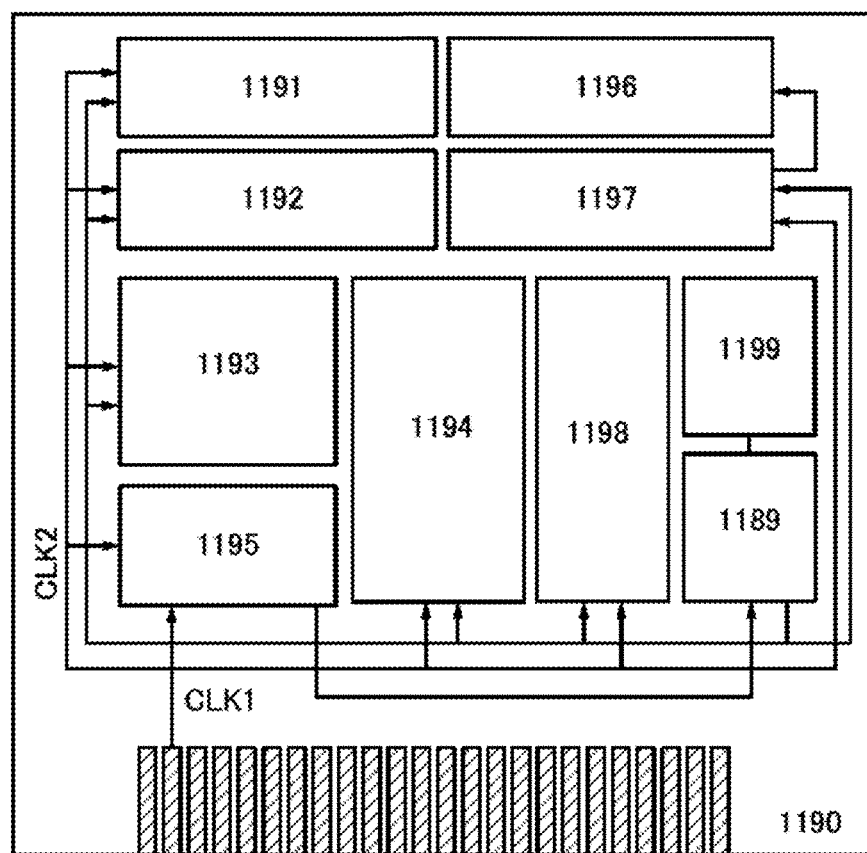
FIG. 21 illustrates a configuration example of a CPU.

FIG. 21 is a block diagram illustrating a configuration example of a CPU at least partly including any of the transistors described in the above embodiments as a component.

The CPU illustrated in FIG. 21 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 21 is just an example in which the configuration is simplified, and an actual CPU may have a variety of configurations depending on the application. For example, the CPU may have the following configuration: a structure including the CPU illustrated in FIG. 21 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 21, a memory cell is provided in the register 1196. For the memory cell of the register 1196, any of the transistors described in the above embodiments can be used.

In the CPU illustrated in FIG. 21, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 22:
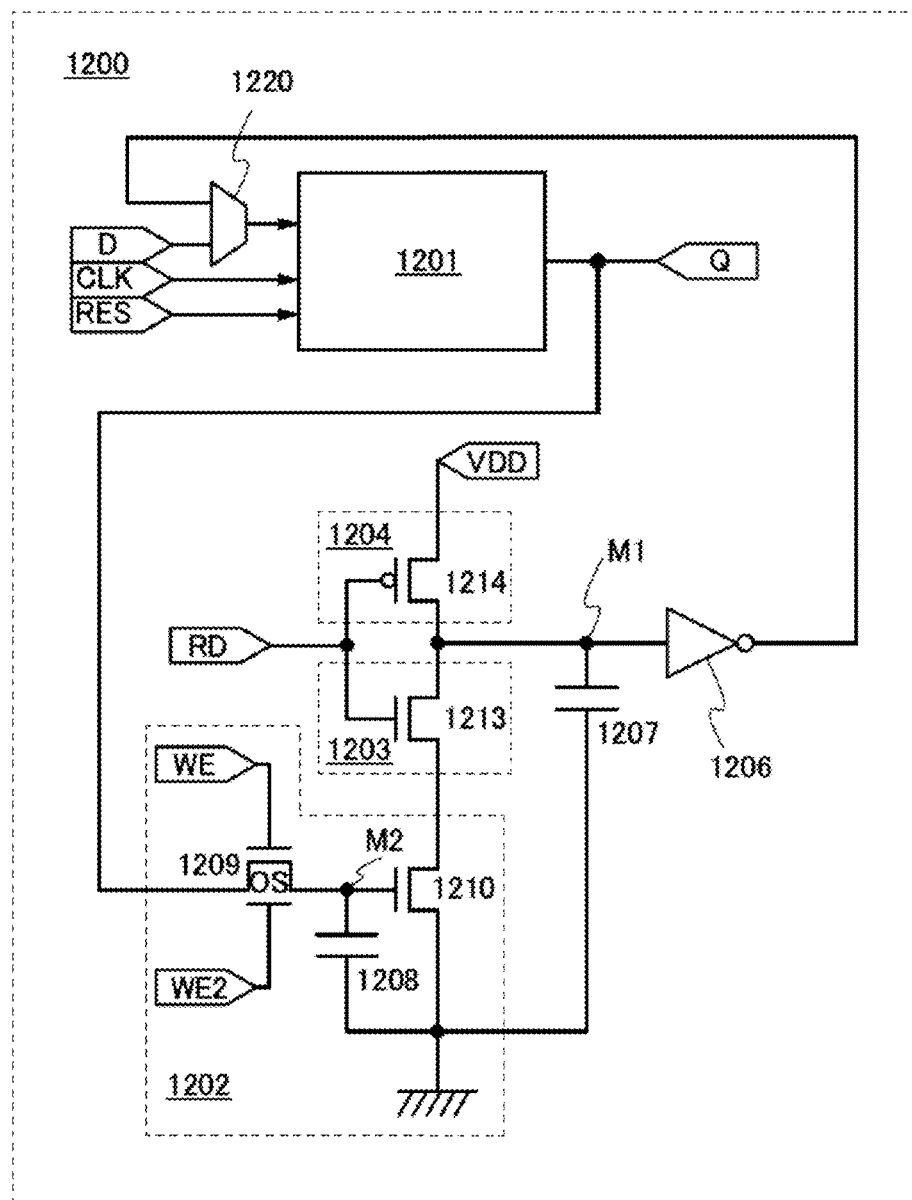
FIG. 22 is a circuit diagram of a memory element.

FIG. 22 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 22 has a structure with a second gate (second gate electrode; back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and Icut of the transistor 1209 can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 22 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 22, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 22, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 22, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) tag.

This embodiment can be combined as appropriate with any of the other embodiments and an example in this specification.

Embodiment 7

In this embodiment, configuration examples of a display device using a transistor of one embodiment of the present invention are described.

Configuration Example

Figure 23A:
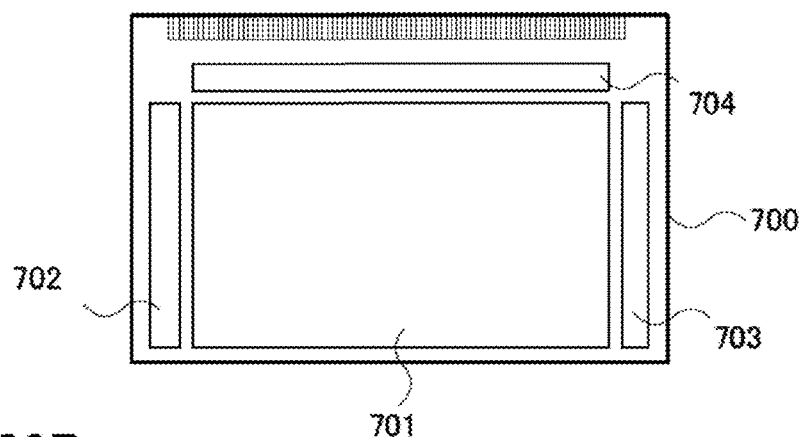
FIG. 23A illustrates a configuration example of a display device.
Figure 23B:
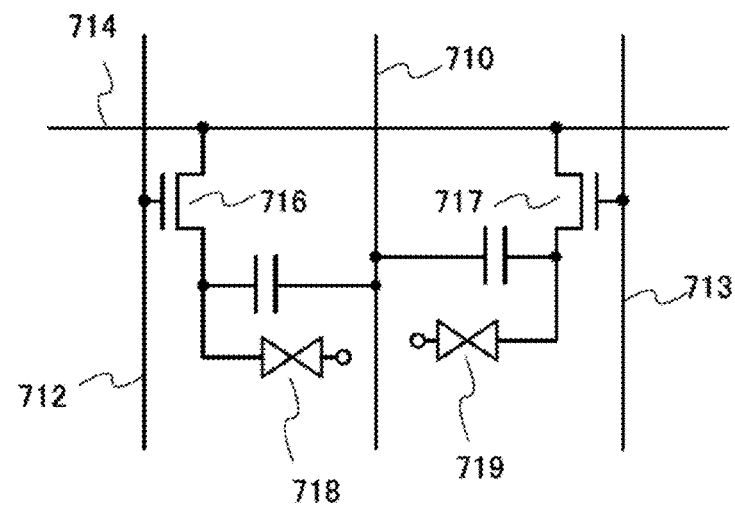
FIGS. 23B and 23C are circuit diagrams of pixels.
Figure 23C:
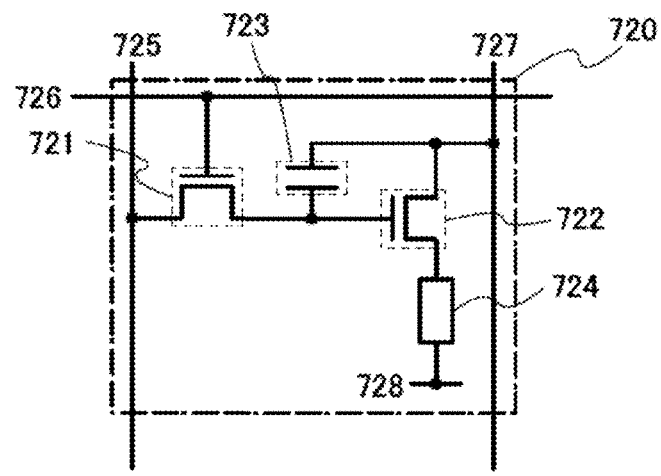

FIG. 23A is a top view of the display device of one embodiment of the present invention. FIG. 23B is a circuit diagram illustrating a pixel circuit that can be used in the case where a liquid crystal element is used in a pixel in the display device of one embodiment of the present invention. FIG. 23C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 23A illustrates an example of a top view of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 23A, the first scan line driver circuit 702, the second scan line driver circuit 703, and the signal line driver circuit 704 are formed over the substrate 700 where the pixel portion 701 is formed. Accordingly, the number of components which are provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Display Device]

FIG. 23B illustrates an example of a circuit configuration of the pixel. Here, a pixel circuit which is applicable to a pixel of a VA liquid crystal display device is illustrated as an example.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a data line 714 is shared by the transistors 716 and 717. The transistor described in any of the above embodiments can be used as appropriate as each of the transistors 716 and 717. Thus, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating film functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 23B. For example, a switch, a resistor, a capacitor, a transistor, a sensor, a logic circuit, or the like may be added to the pixel illustrated in FIG. 23B.

[Organic EL Display Device]

FIG. 23C illustrates another example of a circuit configuration of the pixel. Here, a pixel structure of a display device using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 23C illustrates an applicable example of a pixel circuit. Here, one pixel includes two n-channel transistors. Note that a metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least a forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage which is the sum of power supply line voltage and the threshold voltage Vth of the driver transistor 722 is applied to the signal line 725.

In the case of performing analog grayscale driving, a voltage greater than or equal to a voltage which is the sum of the forward voltage of the light-emitting element 724 and the threshold voltage Vth of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that shown in FIG. 23C. For example, a switch, a resistor, a capacitor, a sensor, a transistor, a logic circuit, or the like may be added to the pixel circuit illustrated in FIG. 23C.

In the case where the transistor shown in any of the above embodiments is used for the circuit shown in FIGS. 23A to 23C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometric modulator display (IMOD) element, an electrowetting element, a piezoelectric ceramic display, or a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices including electronic ink or electrophoretic elements include electronic paper.

This embodiment can be combined as appropriate with any of the other embodiments and an example in this specification.

Embodiment 8

In this embodiment, a display module using a semiconductor device of one embodiment of the present invention is described with reference to FIG. 24.

Figure 24:
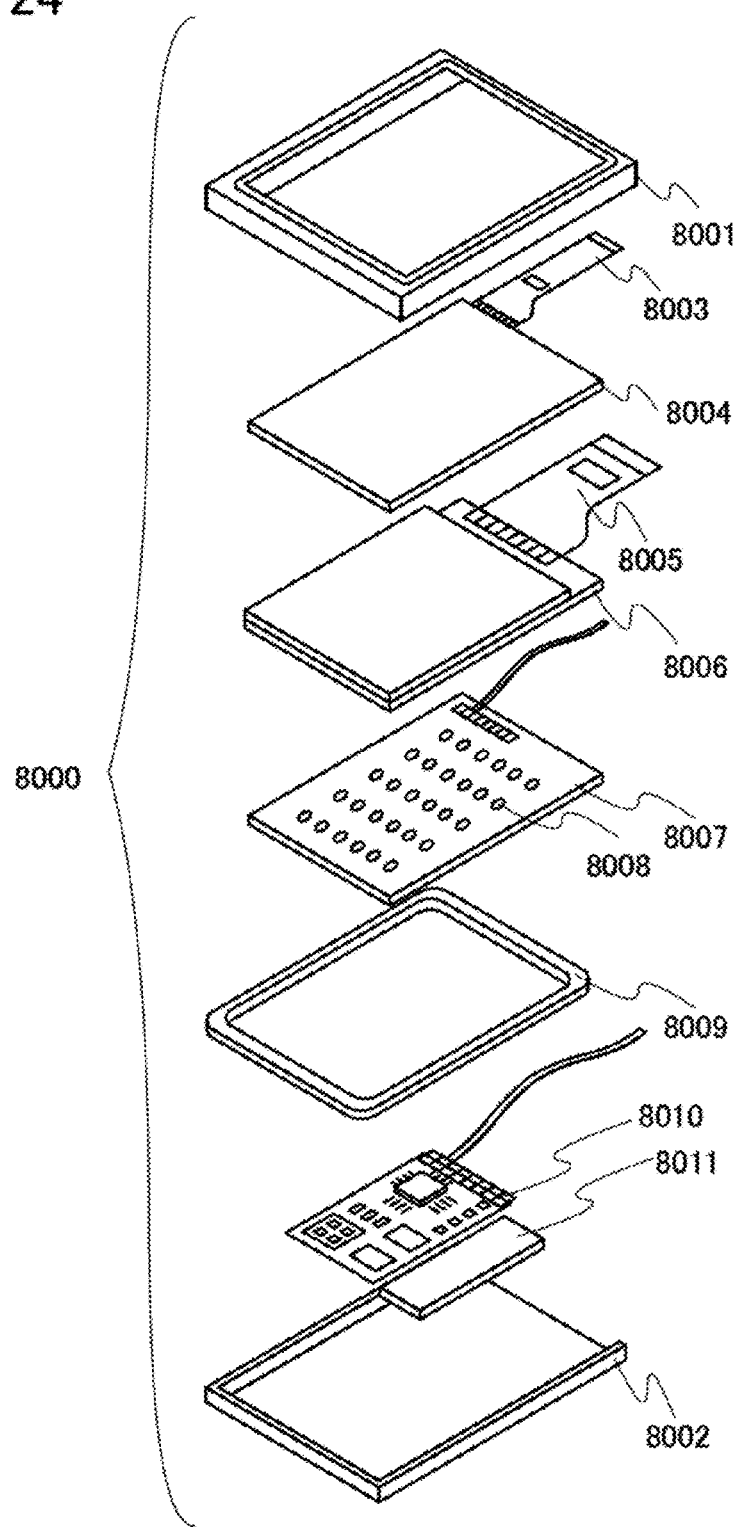
FIG. 24 illustrates a display module.

In a display module 8000 in FIG. 24, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed to overlap with the display panel 8006. A counter substrate (sealing substrate) of the display panel 8006 can have a touch panel function. A photosensor may be provided in each pixel of the display panel 8006 so that an optical touch panel is obtained. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 can be additionally provided with a member such as a polarizing plate, a retardation plate, or a prism sheet.

This embodiment can be combined as appropriate with any of the other embodiments and an example in this specification.

Embodiment 9

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

Figure 25A:
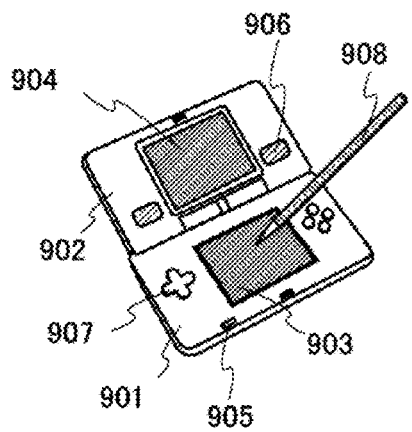
FIGS. 25A to 25F each illustrate an electronic device.

FIG. 25A illustrates a portable game console including a housing 901, a housing 902, a display portion 903, a display portion 904, a microphone 905, a speaker 906, an operation key 907, a stylus 908, and the like. Although the portable game machine in FIG. 25A has the two display portions 903 and 904, the number of display portions included in a portable game machine is not limited to this.

Figure 25B:
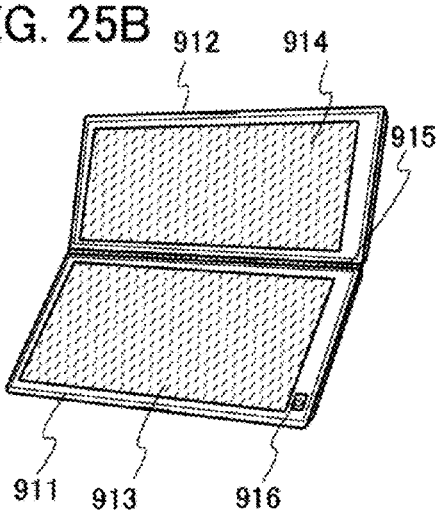

FIG. 25B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 25C:
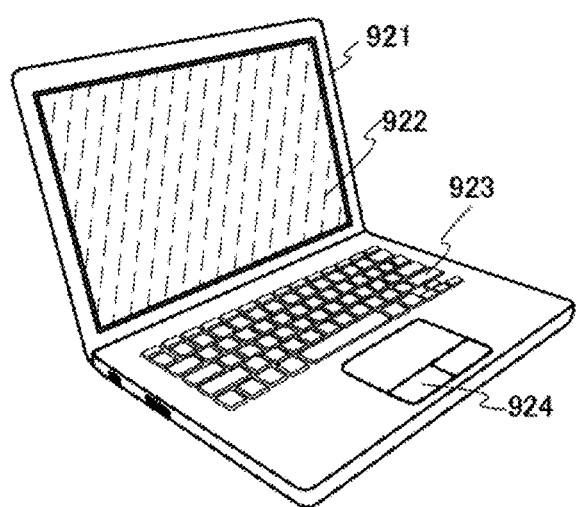

FIG. 25C illustrates a laptop personal computer, which includes a housing 921, a display portion 922, a keyboard 923, a pointing device 924, and the like.

Figure 25D:
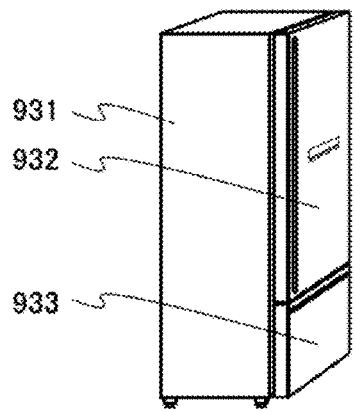

FIG. 25D illustrates an electric refrigerator-freezer including a housing 931, a door for a refrigerator 932, a door for a freezer 933, and the like.

Figure 25E:
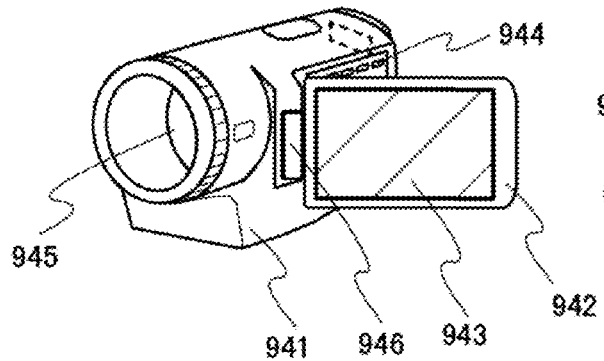

FIG. 25E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 25F:
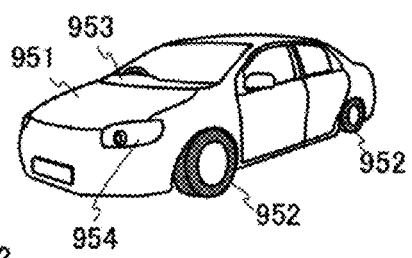
Figure 26A:
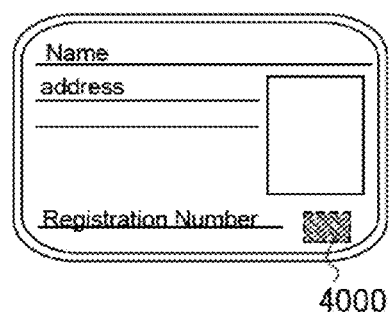
FIGS. 26A to 26F illustrate usage examples of an RF tag.
Figure 26B:
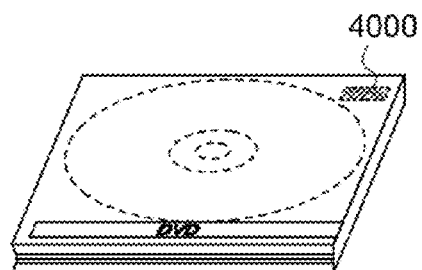
Figure 26C:
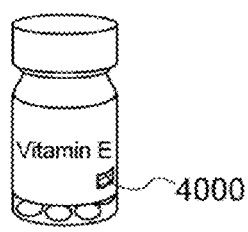
Figure 26D:
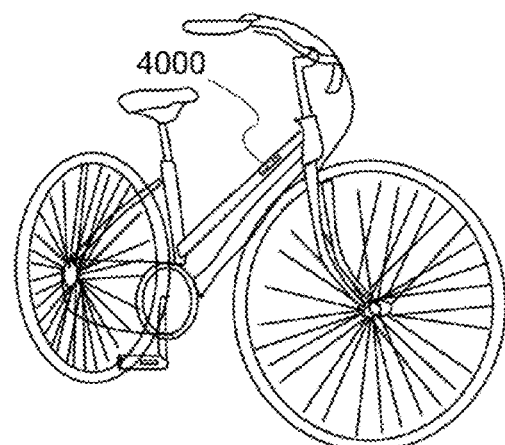
Figure 26E:
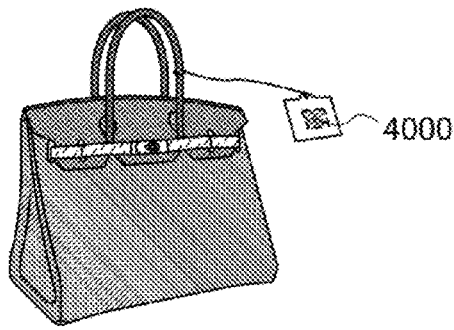
Figure 26F:
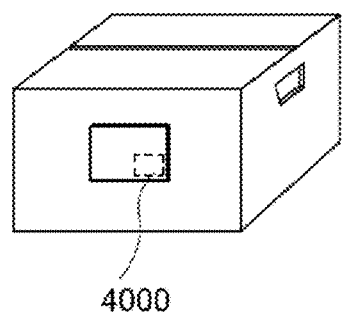

FIG. 25F illustrates an ordinary vehicle including a car body 951, wheels 952, a dashboard 953, lights 954, and the like.

This embodiment can be combined as appropriate with any of the other embodiments and an example in this specification.

Embodiment 10

In this embodiment, application examples of an RF tag of one embodiment of the present invention will be described with reference to FIGS. 26A to 26F. The RF tag is widely used and can be provided for, for example, products such as bills, coins, securities, bearer bonds, documents (e.g., driver's licenses or resident's cards, see FIG. 26A), recording media (e.g., DVD or video tapes, see FIG. 26B), vehicles (e.g., bicycles, see FIG. 26D), packaging containers (e.g., wrapping paper or bottles, see FIG. 26C), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 26E and 26F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

This embodiment can be combined as appropriate with any of the other embodiments and an example in this specification.

EXAMPLE

In this example, transistors were formed and cross sections of the transistors were observed. The results are described below.

[Formation of Samples]

As samples for cross-sectional observation, samples corresponding to the transistor 103 and the transistor 101 described in Embodiment 1 were formed by the methods described in Embodiment 2. Two samples with different channel widths were formed as the samples corresponding to the transistor 103.

A silicon wafer was used as a substrate for each of the samples. The silicon wafer was subjected to thermal oxidation, whereby a thermal oxide film was formed. A silicon oxynitride film was formed over the thermal oxide film by a plasma CVD method.

Next, in each of the samples corresponding to the transistor 103, an approximately 20-nm-thick first oxide semiconductor film and an approximately 40-nm-thick second oxide semiconductor film having a composition different from that of the first oxide semiconductor film were deposited in this order by a sputtering method. In the sample corresponding to the transistor 101, an approximately 20-nm-thick oxide semiconductor film was deposited by a sputtering method.

After that, a tungsten film and an organic resin were formed over the second oxide semiconductor film of each of the samples corresponding to the transistor 103 and over the oxide semiconductor film of the sample corresponding to the transistor 101. Then, a negative resist film was formed, and exposure was performed on the resist film by scanning with an electron beam and development was performed, whereby the resist film was patterned.

Then, in each of the samples, the organic resin and the tungsten film were selectively etched using the resist film. An inductively coupled plasma dry etching apparatus was used for the etching.

Next, in each of the samples corresponding to the transistor 103, the first oxide semiconductor film and the second oxide semiconductor film were selectively etched with the use of the organic resin and the tungsten film as a mask; thus, a stack including a first oxide semiconductor layer and a second oxide semiconductor layer was formed. Similarly, in the sample corresponding to the transistor 101, the oxide semiconductor film was selectively etched with the use of the organic resin and the tungsten film as a mask; thus, an oxide semiconductor layer was formed.

Then, in each of the samples, the resist film and the organic resin were removed by an ashing step, and the tungsten film was removed by an etching step.

Next, a tungsten film was formed by a sputtering method over the second oxide semiconductor layer of each of the samples corresponding to the transistor 103 and over the oxide semiconductor layer of the sample corresponding to the transistor 101. Then, in each of the samples, a resist film pattern was formed over the tungsten film and selective etching was performed to form a source electrode layer and a drain electrode layer.

After that, a 5-nm-thick third oxide semiconductor film was formed by a sputtering method over the stack including the first oxide semiconductor layer and the second oxide semiconductor layer, the source electrode layer, and the drain electrode layer of each of the samples corresponding to the transistor 103.

Next, a silicon oxynitride film to be a gate insulating film was formed by a plasma CVD method over the third oxide semiconductor film of each of the samples corresponding to the transistor 103 and over the oxide semiconductor layer, the source electrode layer, and the drain electrode layer of the sample corresponding to the transistor 101.

Then, in each of the samples, a titanium nitride film and a tungsten film were successively formed by a sputtering method. After that, a resist film pattern was formed over the tungsten film.

In each of the samples corresponding to the transistor 103, the titanium nitride film and the tungsten film were selectively etched with the use of the resist film, whereby a gate electrode layer was formed. In addition, the gate insulating film and the third oxide semiconductor film were etched with the use of the gate electrode layer as a mask; thus, a third oxide semiconductor layer was formed.

In the sample corresponding to the transistor 101, the titanium nitride film and the tungsten film were selectively etched with the use of the resist film, whereby a gate electrode layer was formed.

Next, in each of the samples, an aluminum oxide film and a silicon oxynitride film were formed as insulating layers.

Through the above steps, the samples corresponding to the transistor 103 and the sample corresponding to the transistor 101 were formed.

[Cross-Sectional Observation]

The cross sections of the formed samples (samples 1 to 3) were observed with a scanning transmission electron microscope (STEM).

Figure 27A:
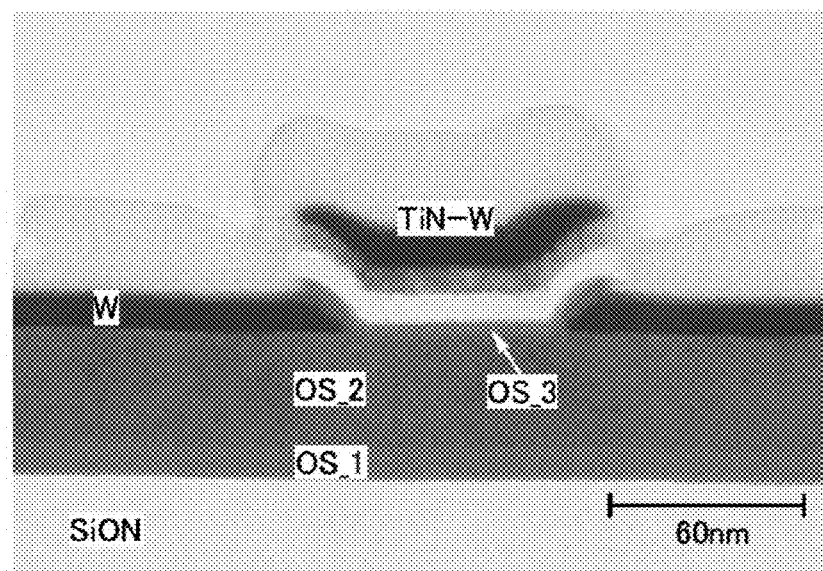
FIGS. 27A and 27B are each a cross-sectional TEM image of a transistor.
Figure 27B:
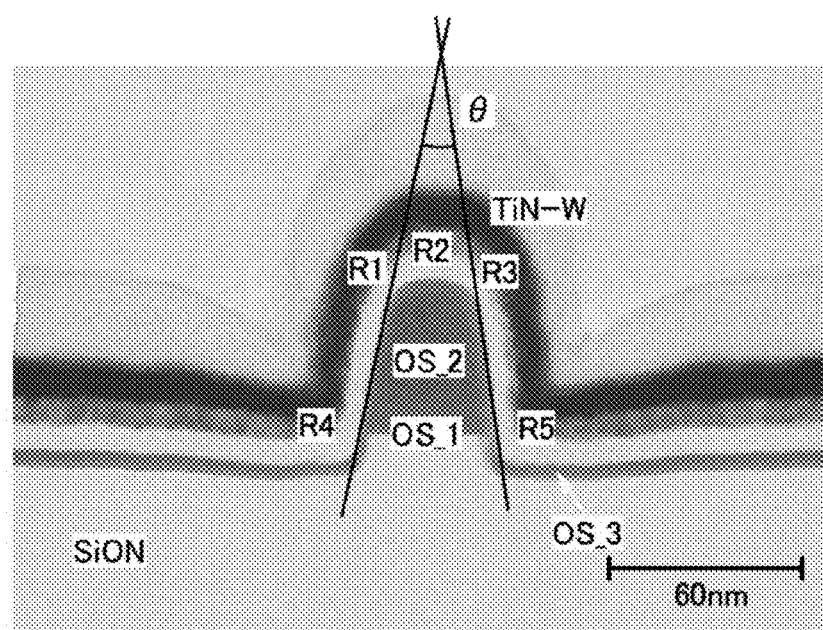

FIGS. 27A and 27B are cross-sectional images of the sample 1 corresponding to the transistor 103. FIG. 27A shows a cross section in the channel length direction.

FIG. 27B shows a cross section in the channel width direction. According to the cross-sectional images in FIGS. 27A and 27B, the channel length and the channel width are 68.3 nm and 34.3 nm, respectively.

According to FIG. 27B, R1 to R5 and θ defined in FIG. 8B and FIG. 9 are as follows: R1 and R3 are each approximately 8.8 nm, R2 is approximately 19.0 nm, R4 and R5 are each approximately 7.3 nm, and θ is 20.5°. The transistor exhibited favorable electrical characteristics.

Thus, it was demonstrated that the sample 1 satisfies the following requirements described in Embodiment 1: R2 is larger than R1 and R3; R1 and R3 are substantially equal to each other; R4 and R5 are substantially equal to each other; R1 and R3 are each larger than R4 and R5; and θ is greater than or equal to 5° and less than or equal to 45°.

Figure 28:
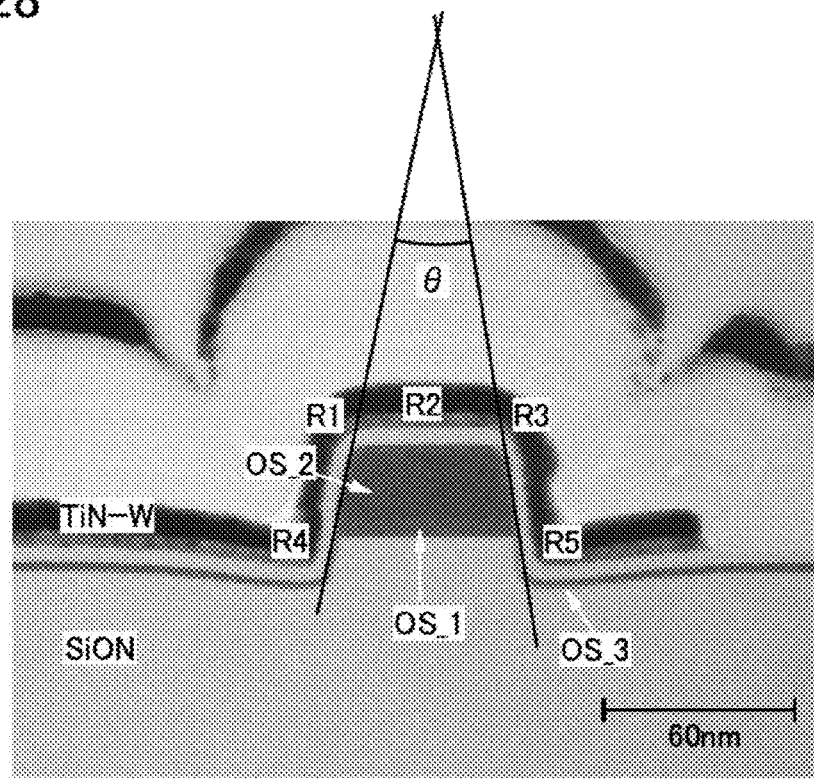
FIG. 28 is a cross-sectional TEM image of a transistor.

FIG. 28 is a cross-sectional image in the channel width direction of the sample 2 that corresponds to the transistor 103 and has a channel width different from that of the sample 1. According to the cross-sectional image in FIG. 28, the channel width is 91.3 nm.

According to FIG. 28, R1 to R5 and ζ defined in FIG. 8B and FIG. 9 are as follows: R1 and R3 are each approximately 4.8 nm, R2 was difficult to measure (this suggests that R2 is substantially infinite), R4 and R5 are each approximately 3.9 nm, and θ is 21.0°. The transistor exhibited favorable electrical characteristics.

Thus, it was demonstrated that the sample 2 satisfies the following requirements described in Embodiment 1: R2 is larger than R1 and R3; R1 and R3 are substantially equal to each other; R4 and R5 are substantially equal to each other; R1 and R3 are each larger than R4 and R5; and θ is greater than or equal to 5° and less than or equal to 45°.

Figure 29:
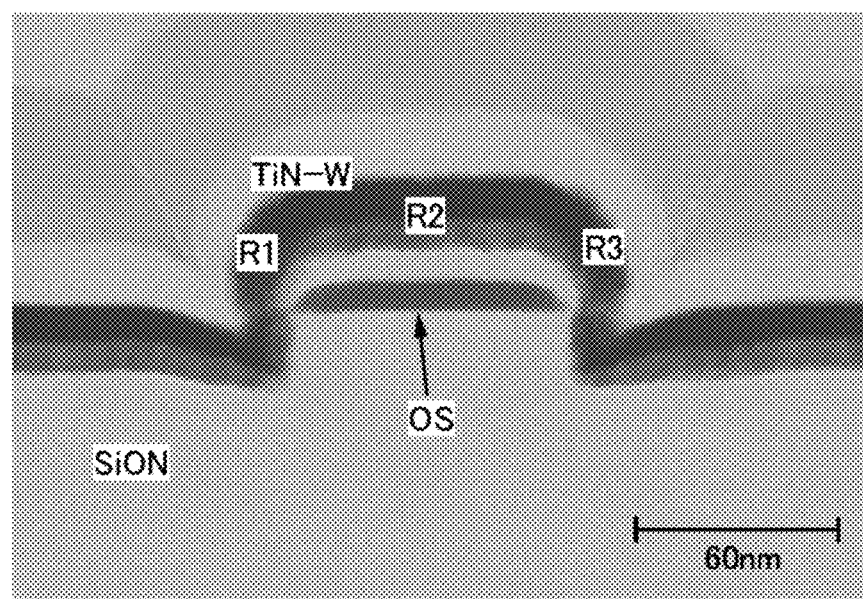
FIG. 29 is a cross-sectional TEM image of a transistor.

FIG. 29 is a cross-sectional image in the channel width direction of the sample 3 corresponding to the transistor 101. According to the cross-sectional image in FIG. 29, the channel width is 82.7 nm.

According to FIG. 29, R1 to R3 defined in FIG. 2B are as follows: R1 and R3 are each approximately 16.1 nm, and R2 is approximately 421 nm. The transistor exhibited favorable electrical characteristics.

Thus, it was demonstrated that the sample 3 satisfies the following requirements described in Embodiment 1: R2 is larger than R1 and R3; and R1 and R3 are substantially equal to each other.

Note that it was difficult to accurately measure R4, R5, and θ from the cross-sectional image in FIG. 29. Observation using a TEM with higher magnification enables accurate measurement of R4, R5, and θ.

The above results of this example indicate that a transistor of one embodiment of the present invention has favorable electrical characteristics.

Note that this example can be combined with any of the embodiments in this specification as appropriate.

This application is based on Japanese Patent Application serial no. 2013-219046 filed with Japan Patent Office on Oct. 22, 2013, the entire contents of which are hereby incorporated by reference.

What is claimed is:

1. A semiconductor device comprising:
an insulating layer;
a semiconductor layer over the insulating layer;
a source electrode layer and a drain electrode layer electrically connected to the semiconductor layer;
a gate insulating layer over the semiconductor layer, the source electrode layer, and the drain electrode layer; and
a gate electrode layer overlapping with the semiconductor layer with the gate insulating layer positioned therebetween,
wherein in a cross section in a channel width direction, the semiconductor layer comprises:
a first region of which one end portion is in contact with the insulating layer, the first region being positioned at one side portion of the semiconductor layer;
a second region of which one end portion is in contact with the other end portion of the first region, the second region being positioned at an upper portion of the semiconductor layer; and
a third region of which one end portion is in contact with the other end portion of the second region and the other end portion is in contact with the insulating layer, the third region being positioned at the other side portion of the semiconductor layer,
wherein the first region, the second region, and the third region are in contact with the gate insulating layer,
wherein in the second region, a second interface with the gate insulating layer is convex and has a region with a curvature radius R1, a region with a curvature radius R2, and a region with a curvature radius R3 that are connected in this order from the one end portion side toward the other end portion side,
wherein in the first region, a first interface with the gate insulating layer is concave and has a region with a curvature radius R4 at the one end portion of the first region, wherein in the third region, a third interface with the gate insulating layer is concave and has a region with a curvature radius R5 at the other end portion of the third region, and wherein R2 is larger than R1 and R3.

2. The semiconductor device according to claim 1, wherein R1 and R3 are each larger than R4 and R5.

3. The semiconductor device according to claim 1, wherein R2 is at least twice as large as a smaller one of R1 and R3.

4. The semiconductor device according to claim 2, wherein R1 and R3 are each at least three times as large as a smaller one of R4 and R5.

5. The semiconductor device according to claim 1, wherein R1 divided by R3 is greater than or equal to 0.7 and less than or equal to 1.3.

6. The semiconductor device according to claim 1, wherein an angle formed by a line coinciding with the first interface and extending to a gate electrode layer side and a line coinciding with the third interface and extending to the gate electrode layer side is greater than or equal to 5° and less than or equal to 45°.

7. The semiconductor device according to claim 1, wherein a height of the semiconductor layer in the cross section in the channel width direction is greater than or equal to 30 nm and less than or equal to 3000 nm.

8. The semiconductor device according to claim 1, wherein a height of the semiconductor layer in the cross section in the channel width direction divided by a channel width is greater than or equal to 0.5.

9. The semiconductor device according to claim 1, further comprising a conductive layer overlapping with the gate electrode layer with the semiconductor layer positioned therebetween.

10. The semiconductor device according to claim 1, wherein the semiconductor layer is an oxide semiconductor layer.

11. The semiconductor device according to claim 10, wherein the oxide semiconductor layer includes a first oxide semiconductor layer, a second oxide semiconductor layer, and a third oxide semiconductor layer stacked in this order from the insulating layer side, wherein the first oxide semiconductor layer, the second oxide semiconductor layer, and the third oxide semiconductor layer each contain an In-M-Zn oxide where M is Al, Ti, Ga, Y, Zr, Sn, La, Ce, Nd, or Hf, and wherein an atomic ratio of M to In in each of the first oxide semiconductor layer and the third oxide semiconductor layer is higher than an atomic ratio of M to In in the second oxide semiconductor layer.

12. A semiconductor device comprising:

an insulating layer;

a stack including a first semiconductor layer and a second semiconductor layer in this order over the insulating layer;

a source electrode layer and a drain electrode layer electrically connected to part of the stack;

a third semiconductor layer covering part of the stack, part of the source electrode layer, and part of the drain electrode layer;

a gate insulating layer over the third semiconductor layer; and a gate electrode layer over the gate insulating layer and overlapping with part of the stack, part of the source electrode layer, part of the drain electrode layer, and the third semiconductor layer, wherein in a cross section in a channel width direction, the third semiconductor layer comprises:

a first region covering one side portion of the stack;

a second region covering an upper portion of the second semiconductor layer; and a third region covering the other side portion of the stack, wherein the first region, the second region, and the third region are in contact with the gate insulating layer, wherein in the second region, a second interface with the gate insulating layer is convex and has a region with a curvature radius R1, a region with a curvature radius R2, and a region with a curvature radius R3 that are connected in this order from one end portion side toward the other end portion side, and wherein R2 is larger than R1 and R3.

13. The semiconductor device according to claim 12, wherein in the first region, a first interface with the gate insulating layer is concave and has a region with a curvature radius R4 at the one end portion of the first region, wherein in the third region, a third interface with the gate insulating layer is concave and has a region with a curvature radius R5 at the other end portion of the third region, and wherein R1 and R3 are each larger than R4 and R5.

14. The semiconductor device according to claim 12, wherein R2 is at least twice as large as a smaller one of R1 and R3.

15. The semiconductor device according to claim 13, wherein R1 and R3 are each at least three times as large as a smaller one of R4 and R5.

16. The semiconductor device according to claim 12, wherein R1 divided by R3 is greater than or equal to 0.7 and less than or equal to 1.3.

17. The semiconductor device according to claim 13, wherein an angle formed by a line coinciding with the first interface and extending to a gate electrode layer side and a line coinciding with the third interface and extending to the gate electrode layer side is greater than or equal to 5° and less than or equal to 45°.

18. The semiconductor device according to claim 12, wherein a total height of the first semiconductor layer, the second semiconductor layer, and the third semiconductor layer in the cross section in the channel width direction divided by a channel width is greater than or equal to 0.5.

19. The semiconductor device according to claim 12, further comprising a conductive layer overlapping with the gate electrode layer with the first semiconductor layer, the second semiconductor layer, and the third semiconductor layer positioned therebetween.

20. The semiconductor device according to claim 12, wherein the first semiconductor layer, the second semiconductor layer, and the third semiconductor layer are each an oxide semiconductor layer containing an In-M-Zn oxide where M is Al, Ti, Ga, Y, Zr, Sn, La, Ce, Nd, or Hf, and wherein an atomic ratio of M to In in each of the first semiconductor layer and the third semiconductor layer is higher than an atomic ratio of M to In in the second semiconductor layer.

21. A semiconductor device comprising:

a semiconductor layer over an insulating surface;

source and drain electrode layers electrically connected to the semiconductor layer;

a gate electrode layer overlapping with the semiconductor layer with a gate insulating layer therebetween, wherein:
the semiconductor layer is in contact with the gate insulating layer,
in a cross section in a channel width direction, the semiconductor layer comprises a first region at one side portion of the semiconductor layer, a second region at an upper portion of the semiconductor layer, and a third region at the other side portion of the semiconductor layer,
one end portion of the first region is in contact with the insulating surface,
one end portion of the third region is in contact with the insulating surface,
end portions of the second region are in contact with the other end portion of the first region and the other end portion of the third region, respectively,
in the first region, a first interface with the gate insulating layer is concave,
in the second region, a second interface with the gate insulating layer is convex, and
in the third region, a third interface with the gate insulating layer is concave.

22. The semiconductor device according to claim 21, wherein:
the second interface has a region with a curvature radius R1, a region with a curvature radius R2, and a region with a curvature radius R3 that are connected in this order from the one end portion side toward the other end portion side, and
R2 is larger than R1 and R3.

23. The semiconductor device according to claim 22, wherein:
the first interface has a region with a curvature radius R4 at the one end portion of the first region,
the third interface has a region with a curvature radius R5 at the other end portion of the third region, and
R1 and R3 are each larger than R4 and R5.

24. The semiconductor device according to claim 21, wherein the semiconductor layer is an oxide semiconductor layer.

25. The semiconductor device according to claim 24, wherein:
the oxide semiconductor layer includes a first oxide semiconductor layer, a second oxide semiconductor layer and a third oxide semiconductor layer stacked in this order from the insulating surface side,
the first oxide semiconductor layer, the second oxide semiconductor layer and the third oxide semiconductor layer each contain an In-M-Zn oxide where M is Al, Ti, Ga, Y, Zr, Sn, La, Ce, Nd, or Hf, and
an atomic ratio of M to In in each of the first oxide semiconductor layer and the third oxide semiconductor layer is higher than an atomic ratio of M to In in the second oxide semiconductor layer.

* * * * *